(12) United States Patent
Venkataraman et al.

(10) Patent No.: US 10,007,286 B2
(45) Date of Patent: Jun. 26, 2018

(54) SWITCHING REGULATOR OVERLOAD DETECTOR

(71) Applicant: SUNRISE MICRO DEVICES, INC., Deerfield Beach, FL (US)

(72) Inventors: Vasan Venkataraman, Fort Lauderdale, FL (US); Daniel Lewis Cross, Boca Raton, FL (US); Edgar H. Callaway, Jr., Boca Raton, FL (US)

(73) Assignee: Sunrise Micro Devices, Inc., Deerfield Beach, FL (US)

( * ) Notice: Subject to any disclaimer, the term of this patent is extended or adjusted under 35 U.S.C. 154(b) by 229 days.

(21) Appl. No.: 14/839,144

(22) Filed: Aug. 28, 2015

(65) Prior Publication Data

US 2016/0026202 A1 Jan. 28, 2016
US 2016/0252921 A9 Sep. 1, 2016

Related U.S. Application Data

(63) Continuation-in-part of application No. 13/556,615, filed on Jul. 24, 2012, now Pat. No. 9,124,131, which is a continuation-in-part of application No. 13/353,470, filed on Jan. 19, 2012, now Pat. No. 8,773,083.

(60) Provisional application No. 62/187,663, filed on Jul. 1, 2015, provisional application No. 62/189,562, filed on Jul. 7, 2015, provisional application No. 61/435,509, filed on Jan. 24, 2011.

(51) Int. Cl.
| | |
|---|---|
| *G05F 1/16* | (2006.01) |
| *G05F 1/66* | (2006.01) |
| *G05B 15/02* | (2006.01) |
| *G01R 31/40* | (2014.01) |
| *H02J 1/14* | (2006.01) |
| *G01R 31/36* | (2006.01) |

(52) U.S. Cl.
CPC ............... *G05F 1/66* (2013.01); *G01R 31/40* (2013.01); *G05B 15/02* (2013.01); *H02J 1/14* (2013.01); *G01R 31/3693* (2013.01)

(58) Field of Classification Search
CPC .................................... G05F 1/16; G05F 1/66
USPC ....... 323/234, 242, 243, 246, 282–285, 288, 323/349, 351
See application file for complete search history.

(56) References Cited

U.S. PATENT DOCUMENTS

| | | |
|---|---|---|
| 5,327,071 A | 7/1994 | Frederick et al. |
| 6,054,861 A | 4/2000 | Takahashi |
| 6,160,490 A | 12/2000 | Pace et al. |

(Continued)

FOREIGN PATENT DOCUMENTS

| | | |
|---|---|---|
| JP | 2002-093465 | 3/2002 |
| KR | 10-2004-0076535 | 9/2004 |

(Continued)

*Primary Examiner* — Adolf Berhane
*Assistant Examiner* — Nusrat Quddus
(74) *Attorney, Agent, or Firm* — Leveque IP Law, P.C.

(57) ABSTRACT

A method, apparatus, and device provide for the detection of the adequacy of the current sourcing capability of a power source. The current sourcing capability of the power source is dynamically detected by sampling comparison values obtained during one or more sampling sub-windows and determining a sample density of comparison values. In response to the sample density of comparison values crossing a selectable density threshold, an insufficient-supply indication is generated.

17 Claims, 18 Drawing Sheets

(56) References Cited

U.S. PATENT DOCUMENTS

| | | |
|---|---|---|
| 6,285,164 B1 | 9/2001 | Noda et al. |
| 6,384,579 B2 | 5/2002 | Watanabe |
| 6,897,673 B2 | 5/2005 | Savage et al. |
| 7,112,943 B2 | 9/2006 | Bucur et al. |
| 7,190,102 B2 | 3/2007 | VanderSluis |
| 7,378,225 B2 | 5/2008 | Baldwin et al. |
| 7,554,308 B2 | 6/2009 | Roh et al. |
| 7,566,828 B2 | 6/2009 | Sasaki |
| 7,728,749 B2 | 6/2010 | Sahu |
| 7,876,081 B2 * | 1/2011 | Hachiya ............... H02M 3/156 323/284 |
| 7,928,700 B2 | 4/2011 | Cour |
| 8,194,425 B2 | 6/2012 | Park et al. |
| 8,253,403 B2 | 8/2012 | Chen et al. |
| 8,253,507 B2 | 8/2012 | Tang et al. |
| 8,773,083 B2 | 7/2014 | Martin et al. |
| 2003/0221133 A1 | 1/2003 | Nguyen et al. |
| 2003/0169020 A1 | 9/2003 | Malcolm |
| 2004/0046527 A1 | 3/2004 | VanderSluis |
| 2004/0164711 A1 | 8/2004 | Hayashi |
| 2007/0103134 A1 | 5/2007 | Yang et al. |
| 2008/0136393 A1 | 6/2008 | Yang et al. |
| 2009/0160409 A1 | 6/2009 | Carmen |
| 2011/0199062 A1 | 8/2011 | Singnurkar |
| 2012/0187925 A1 | 7/2012 | Martin et al. |
| 2012/0286746 A1 | 11/2012 | Martin et al. |

FOREIGN PATENT DOCUMENTS

| | | |
|---|---|---|
| WO | WO 2012/102933 | 8/2012 |
| WO | WO 2014/0180013 | 1/2014 |

\* cited by examiner

SWITCHING REGULATOR OVERLOAD DETECTOR

PRIORITY CLAIM

This application claims the benefit of Provisional Patent Application No. 62/187,663, filed Jul. 1, 2015 and Provisional Patent Application No. 62/189,562, filed Jul. 7, 2015, the contents of which are hereby incorporated by reference in their entireties. The present application is also a continuation-in-part of patent application Ser. No. 13/556,615, filed Jul. 24, 2012 (now U.S. Pat. No. 9,124,131), which is a continuation-in-part of patent application Ser. No. 13/353,470, filed Jan. 19, 2012 (now U.S. Pat. No. 8,773,083), which claims the benefit of Provisional Patent Application No. 61/435,509, filed Jan. 24, 2011, the contents of which are hereby incorporated by reference in their entireties.

BACKGROUND

It is useful for products powered by batteries, energy-harvesting systems (e.g., solar cells or thermoelectric scavenging), or other variable sources to be able to monitor the voltage supplied by the source. For example, a useful feature for battery-powered products is a "low-battery alert," an alert to notify the user in time to replace the battery before it is completely discharged and service is interrupted.

In addition, it is useful to detect conditions when the power source is unable to support the load presented by the product; upon detection of such a condition the product may be designed to disconnect non-essential loads to preserve the function of essential loads ("load shedding") or take other compensatory action to extend its operational life. Existing products frequently perform this detection by monitoring the voltage supplied to the product by the power source.

Since the internal impedance of the power source may not be negligible, the voltage supplied to the product may vary under varying load conditions. To ensure that an undetected under-voltage condition does not occur, substantially-constant monitoring of the voltage supplied by the source is therefore required. Existing insufficient-supply detectors typically require a dedicated analog comparator and the generation of a reference voltage to use in the comparison process. These circuits consume additional power, and so in many products are often rarely enabled. Undetected insufficient-supply conditions, therefore, can occur, leading to undesired product behaviour. In addition to the undersupply condition problem in which insufficient power is available to the load device from the power source, an oversupply condition of the power source may exist in which too much power is available to the load device and is also of concern.

Since battery-powered products frequently are portable or mobile, it is desirable that their insufficient-supply detectors have small physical size and low power consumption. To achieve this, it would be helpful if the detection can be derived from already available information. It would also be helpful (for power minimization and cost minimization) if the detection circuit is digital.

What is needed is an insufficient-supply detector that is consistent with these requirements. Also of interest is how to address either oversupply or undersupply conditions of a power source as they arise.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
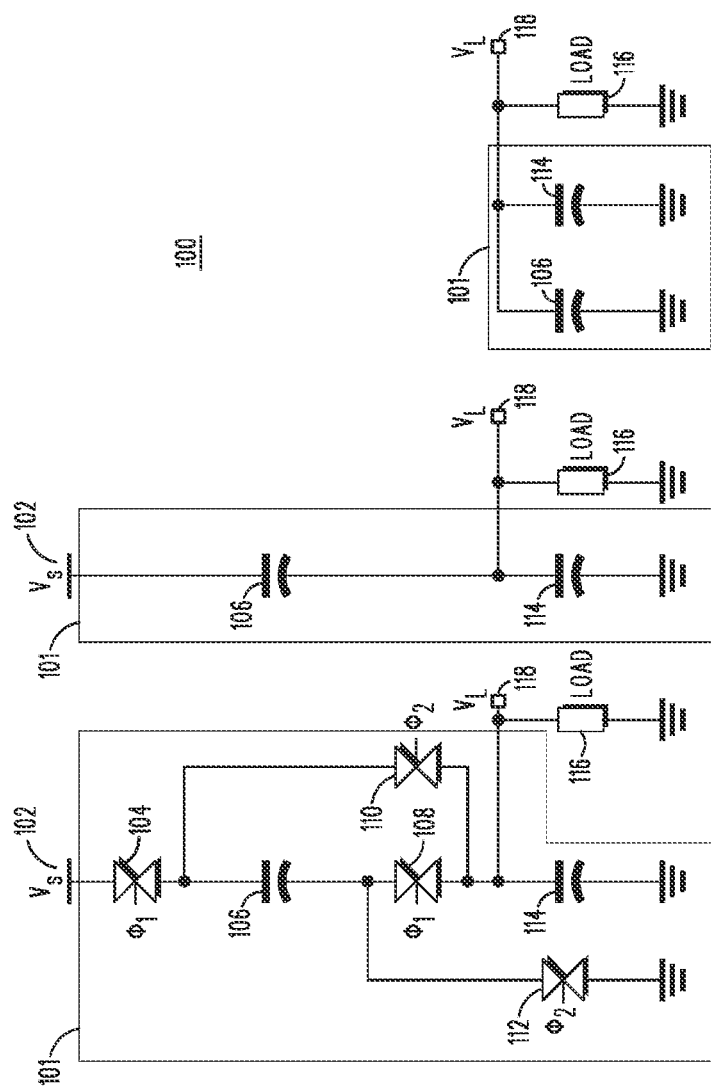
FIGS. 1(A), 1(B), and 1(C) illustrate examples of current multipliers, in accordance with various representative embodiments.

The various methods, apparatus, and devices described herein provide for the detection of insufficient supplied power provided to a device, and also for reaction by the device to the detection of insufficient supplied power.

In accordance with certain embodiments of the present disclosure, there are provided various methodologies for determining the adequacy of the current sourcing capability of a power source, including: dynamically detecting a current sourcing capability of the power source; generating an insufficient-supply indication, that the current sourcing capability of the power source has fallen below a current threshold of a device supplied power by the power source, in response to an overflow condition of a digital counter of the device, the overflow condition caused by a current multiplier of the device to which the digital counter is coupled being unable to achieve a threshold voltage within $N_{count}$ cycles of a clock signal used to clock the digital counter; and in response to the insufficient-supply indication, a control element of the device controlling the device to have a compensatory response.

Further, in accordance with certain additional embodiments of the present disclosure, there is provided an apparatus that determines the adequacy of the current sourcing capability of a power source that supplies power to a device. The apparatus has a current multiplier of the device, operable as a voltage regulator, that is coupled to the power source, receives a clock signal, and generates a control signal; and a digital counter, clocked by the clock signal and reset by the control signal, that generates an overflow output in response to an overflow condition of the digital counter that indicates that the current sourcing capability of the power source has fallen below a current threshold of the device. The digital counter generates the overflow condition of the digital counter in response to the current multiplier of the device being unable to achieve a threshold voltage within $N_{count}$ cycles of the clock signal. As will be discussed the current multiplier resides on the device supplied power by the power source and the digital counter may or may not also reside on the device.

Further, in accordance with certain embodiments of the present disclosure, there is provided a device that is provided power by a power source, with the device having a detection element operable to dynamically detect a current sourcing capability of the power source and generate an insufficient-supply indication when the current sourcing capability of the power source has fallen below a current threshold of the device; and a control element operable to monitor the insufficient-supply indication and, in response to generation of the insufficient-supply indication by the detection element, the control element controls the device to have a compensatory response to the insufficient-supply indication. The detection element has a current multiplier, operable as a voltage regulator and having a control signal, that is coupled to the power source and receives a clock signal; and a digital counter, clocked by the clock signal and reset by the control signal, that generates an overflow output as the insufficient-supply indication in response to an overflow condition of the digital counter.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Current loads drawn by modern portable and mobile products often are very "bursty," meaning that, while their average current may be low (e.g., tens of microamperes in a radio pager), their peak currents can be many orders of magnitude higher for short periods (e.g., 100 mA in a radio pager when its audible alert is active). Cellular telephones (with sleep current near 500 uA, receive currents near 20 mA, and transmit currents 1 A or more) and IEEE 802.15.4 products (with sleep current near 500 nA, receive current of 10 mA, and transmit current of 25 mA or more) are other examples of products with such bursty load currents.

Powering products having such bursty load currents from sources with independently-varying current-sourcing capability (e.g., batteries, solar cells, or other energy harvesting technology) is especially problematic. With both current source capability and current load demand varying, it is a challenge for the product designer to ensure that the source can adequately power the device at all times. If this cannot be ensured, it is desirable for the designer to be able to detect such an event—ideally, far enough in advance so that countermeasures can be taken or the user, or system, warned of the problem.

A warning or alert indication that the power source cannot adequately power the product has many uses. The most familiar may be the "low battery" alert in battery-powered products, used to notify the user in time to replace the battery before it is completely discharged and service is interrupted. Another use for such an alert is load shedding, or the disconnection of non-essential loads to preserve the function of essential loads. Loads often shed in portable products include display backlights, audible user feedback, and non-critical wireless transmission and reception. In addition to these, digital products may have their supply voltage and/or clock speeds lowered, to lower the power consumption of the remaining circuits, at the cost of reduced performance. Load shedding may be extended to the point of actually performing an orderly product shutdown. Load shedding, like the "low battery" alert, may be done under microprocessor control in response to the insufficient-supply detection; in this way the response may be tailored, via software, to the state of the product at the instant the detection of an insufficient power supply is made.

A third use for insufficient-supply detection is the reduction of peak currents by the rescheduling of product actions, spreading them so that they do not occur at the same time. For example, in a user interface a backlight flash and a user-audible alert can be separated in time so that their currents may be separated in time.

Since both the source capability and load demand vary independently, and in a fashion over which the product designer may have limited control, it is useful that data on the sufficiency of the power source be constantly, or at least timely, conveyed to a control element, such as a microprocessor, in as near a real-time manner as is practicable. In this way, even short periods of power supply insufficiency may be identified, and the appropriate countermeasures taken before the function of the product is affected. As will be described, the dynamic detection of the sufficiency of the power source satisfies this need, and allows for the device to take or perform a variety of compensatory responses in response to the detection of an insufficient-supply indication. Dynamically detecting a current sourcing capability of the power source may include periodic or near-constant detection.

Products supplied by variable sources often employ switching converters to convert the voltage presented by a source to a voltage needed by a load. Due to their small physical size and suitability for semiconductor integration, current multipliers, also known as capacitive switching converters and capacitive voltage converters, are well suited for this application.

The current multiplier generates an output current that is a function of the difference between its input voltage and output voltage. A description of its operation follows.

An exemplary current multiplier 101 is shown in FIG. 1(A). As shown in the Figure, source 102 is coupled to switch 104. Capacitor 106 is coupled to switches 104, 108, 110, and 112; capacitor 114 is coupled to switches 108 and 110, load 116, and output 118. Switches 104 and 108 are controlled by clock signal $\varphi_1$; Switches 110 and 112 are controlled by clock signal $\varphi_2$. Clock signals $\varphi_1$ and $\varphi_2$ are non-overlapping, meaning that the two signals are never high at the same instant in time, and are commonly generated from a single clock source.

The current drain multiplication can be analyzed by neglecting the current into load 116 and analyzing the charge transfer. Assume that capacitor 114 is a much higher value than capacitor 106, such that the voltage on capacitor 114 does not change significantly as capacitor 106 charges and discharges. Further, assume that the circuit reaches a steady-state condition before the next clock transition.

Under these assumptions, at the end of phase 1 (i.e., just before clock signal $\varphi_1$ goes low), as shown in FIG. 1(B), the charge transferred to capacitor 114 is $$q_1 = \int i \cdot dt = \int C \cdot dv,$$

where C is the capacitance of capacitor 106 and dv is the change in voltage across capacitor 106 over the time period.

This is equal to $v_S - 2v_L$, where $v_S$ is the voltage at source 102 and $v_L$ is the voltage presented to the load at output 108. In phase 2 (i.e., while clock signal $\varphi_2$ is high), as shown in FIG. 1(C), capacitor 106 discharges into capacitor 114. The charge transfer is the same as in phase 1, such that $q_1 = q_2$. The total charge transfer is $$q = q_1 + q_2 = 2C \int dv.$$

The amount of current from source 102 is $$i_{source} = i \frac{dv}{dt} = i \frac{C(v_S - 2v_L)}{T},$$

where T is the period of clock signals $\varphi_1$ and $\varphi_2$. Recognizing that $i_{load}$, the current into load 116, comprises the charge transferred over time during both phase 1 and phase 2, and recognizing that the two charge transfers are equal, $$i_{load} = 2i_{source} = \frac{2C(v_S - 2v_L)}{T},$$

So, the ideal performance is 2× current enhancement.

The power efficiency is $$\text{efficiency} = 2 \cdot \frac{v_L}{v_S}.$$

Note that efficiency is minimized when $V_S - v_L$ is large, and is maximized when $v_L/v_S = 1$. However, load current approaches zero as $v_L/v_S = 1$.

The maximum load current is a function of $v_S - v_L$, T and C. From the equations it can be seen that for $v_S = 2.6$ V, $v_L = 1.1$ V, C=100 pF, T=1/(32.768 kHz), the maximum current is 5.243 uA, in this exemplary embodiment.

Figure 2:
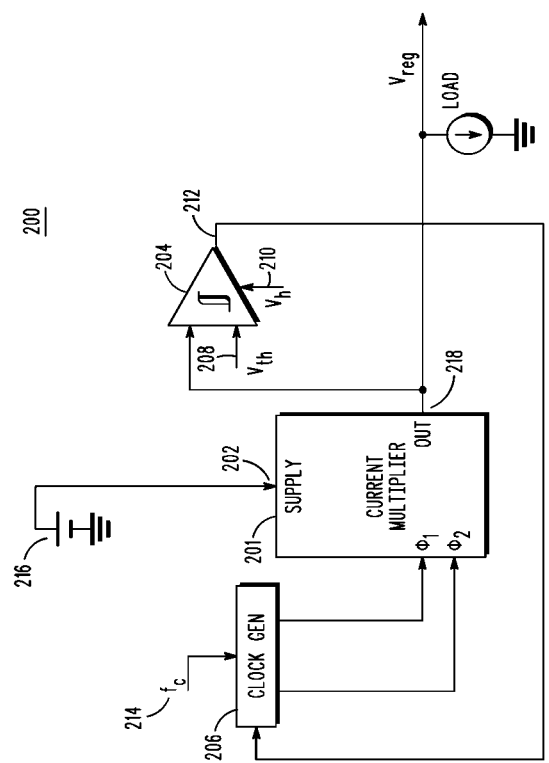
FIG. 2 is a block diagram of an example voltage regulator, in accordance with various representative embodiments.

Current multipliers are often placed in a feedback arrangement, forming a voltage regulator 200 as shown in FIG. 2. In FIG. 2, current multiplier 201 is coupled to supply 216 via input 202. Current multiplier 201 may be, e.g., current multiplier 101 of FIG. 1. Output 218 of current multiplier 201 is coupled to the load, and also to comparator 204. Comparator 204 is coupled to voltage threshold $v_{th}$ via threshold input 208, and hysteresis $v_h$ via hysteresis input 210. Output 212 of comparator 204 is coupled to clock generator 206. Clock generator 206 is coupled to switching clock source 214, having frequency $f_c$, and generates non-overlapping clock signals $\varphi_1$ and $\varphi_2$ coupled to current multiplier 201.

The control structure for multiplier 201 is comparator 204, having a threshold voltage 208, $v_{th}$, and a hysteresis voltage 210, $v_h$, and clock generator 206. When comparator output 212 is high, clock generator 206 is enabled, producing clock signals $\varphi_1$ and $\varphi_2$. Multiplier 201 then conducts, and the voltage at its output 218 rises until the upper threshold of comparator 204, $v_{th} + v_h$, is reached. At that point the comparator output 212 switches low, and clock generator 206 is disabled, stopping clock signals $\varphi_1$ and $\varphi_2$. Multiplier 201 then stops conducting and the voltage at its output 218 drops as the load current drains $C_{load}$ of multiplier 201 (e.g., capacitor 114 inside multiplier 101). When the voltage at output 218 of multiplier 201 drops to the lower threshold of comparator 204, $v_{th}$, comparator output 212 switches high, and the cycle repeats.

The rate ($\Delta v/\Delta t$) at which the voltage at multiplier output 218 increases during the conduction portion of the cycle is proportional to the difference between the maximum current-sourcing capability $I_{max}$ of the multiplier and the actual load current $I_{load}$. This can be described by $$\frac{\Delta v}{\Delta t} = \frac{I_{max} - I_{load}}{C_{load}},$$

where $C_{load}$ is the capacitance of capacitor 114.

If the current-sourcing capability of the power source, $I_{cap}$, is unrestricted, $I_{max}$ is determined by the specific implementation details of voltage regulator 200—principally the values of the capacitors in multiplier 201 and the frequency of switching clock source 214. However, the multiplier can source no more than twice $I_{cap}$. As $I_{cap}$ is reduced, due to a reduction of the source voltage, increase in the source internal impedance, or other cause, a point is reached at which $I_{max}$ becomes limited by $I_{cap}$, rather than voltage regulator 200. As $I_{cap}$ is reduced beyond this point, $I_{max}$ is also reduced.

The action of multiplier 201 and comparator 204 is regulated by the switching clock source 214 and its frequency $f_c$. The rate of voltage increase at multiplier output 218 when multiplier 201 is conducting can be expressed as the number of clock cycles N required for the voltage to rise by an amount equal to the hysteresis voltage $v_h$:

$$\left.\frac{\Delta v}{\Delta t}\right|_{\Delta v = v_h} = \frac{v_h f_c}{N} = \frac{I_{max} - I_{load}}{C_{load}}.$$

A limit on the number of cycles (N) can be set by setting a minimum value of $I_{max} - I_{load}$ based on some fraction (x) of the minimum designed value of $I_{max}$. The maximum number of cycles $N_{max}$ can be expressed $$N_{max} = \frac{v_h f_c C_{load}}{x I_{max}}.$$

Finally, if $I_{cap}$ is in the regime where it limits $I_{max}$, $$N_{max} = \frac{v_h f_c C_{load}}{2 x I_{cap}}.$$

Figure 3:
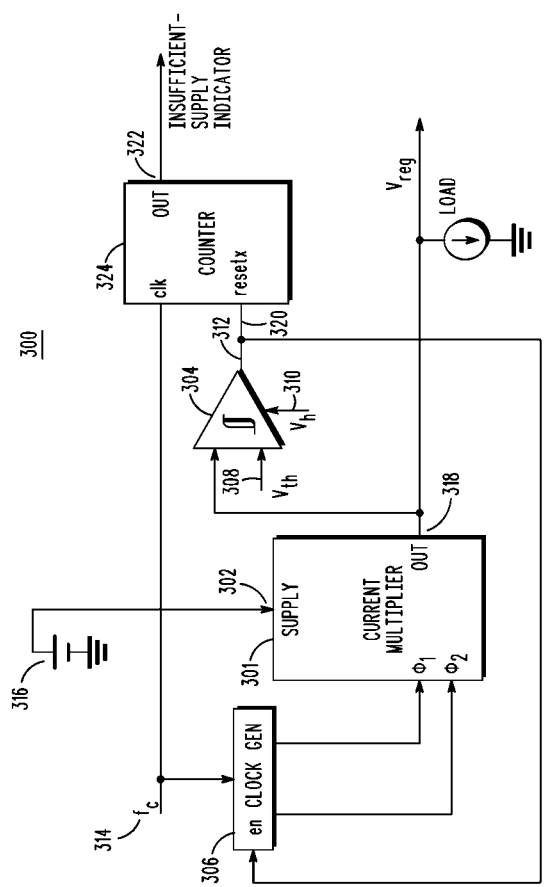
FIG. 3 is a block diagram of an example insufficient-supply detector, in accordance with various representative embodiments.

An exemplary embodiment is illustrated in the block diagram of an insufficient-supply detector shown in FIG. 3. As will now be described, an apparatus that determines the adequacy of the current sourcing capability of a power source that supplies power to a device, has a current multiplier of the device, operable as a voltage regulator, that is coupled to the power source, receives a clock signal, and generates a control signal; and a digital counter, clocked by the clock signal and reset by the control signal, that generates an overflow output in response to an overflow condition of the digital counter that indicates that the current sourcing capability of the power source has fallen below a current threshold of the device. The digital counter generates the overflow condition of the digital counter in response to the current multiplier of the device being unable to achieve a threshold voltage within $N_{count}$ cycles of the clock signal described below. Operation of the apparatus may be embodied within a device being supplied power, in which case both the current multiplier and the digital counter reside on the device, or the digital counter of the apparatus may not reside on the device.

A device embodying the detection capabilities described herein may be considered to have a detection element operable to dynamically detect a current sourcing capability of the power source and to generate an insufficient-supply indication when the current sourcing capability of the power source has fallen below a current threshold of the device; and a control element operable to monitor the insufficient-supply indication and, in response to generation of the insufficient-supply indication by the detection element, to control the device to have a compensatory response to the insufficient-supply indication. The detection element of the device has a current multiplier, operable as a voltage regulator and having a control signal, that is coupled to the power source and receives a clock signal; and a digital counter, clocked by the clock signal and reset by the control signal, that generates an overflow output as the insufficient-supply indication in response to an overflow condition of the digital counter.

As will be described, the compensatory response may be an alert indication, such as a low-battery indication generated by the device under control of the control element, that the current sourcing capability of the power source has fallen below the current threshold of the device. The compensatory response may be the control element selectively reducing load current drawn by the device. Load shedding may be accomplished by the control element selectively shutting down operation of one or more load elements of the device that draw current when operational, or even an orderly shut-down of the device itself. Reducing load current drawn by the device may further be accomplished by the control element selectively lowering power consumption of the device, such as by selectively reducing a supply voltage of the device or a clock speed of one or more clocks of the device. Moreover, selectively scheduling the occurrence in time of one or more functions of the device by the control element may be performed to reduce load current drawn by the device.

Referring now to FIG. 3, current multiplier 301 is coupled to supply 316 via input 302. Current multiplier 301 may be, e.g., current multiplier 101 of FIG. 1. Output 318 of current multiplier 301 is coupled to the load, and also to comparator 304. Comparator 304 is coupled to voltage threshold $v_{th}$ via threshold input 308, and hysteresis $v_h$ via hysteresis input 310. Output 312 of comparator 304 is coupled to clock generator 306 and to resetx input 320 of counter 324. Clock generator 306 is coupled to switching clock source 314, having frequency $f_c$, and generates non-overlapping clock signals $\varphi_1$ and $\varphi_2$ coupled to current multiplier 301. Counter 324 is coupled to switching clock source 314, and has an output 322 representing an insufficient-supply indicator.

Couplings between blocks in FIG. 3 may be wireless. In addition, clock generator 306 and counter 324 need not reside on the same device as current multiplier 301. For example, clock generator 306 and counter 324 may reside on a laptop computer, while current multiplier 301 may reside on a docking station coupled to the laptop.

Operation of the voltage regulator formed by current multiplier 301 and comparator 304 of FIG. 3 is similar to that of voltage regulator 200 shown in FIG. 2. In addition, when comparator output 312 goes high and multiplier 301 conducts, resetx 320 of counter 324 is released, and counter 324 counts cycles (N) from clock source 314. If comparator output 312 goes low, stopping conduction of multiplier 301, before counter 324 overflows, resetx 320 is asserted and overflow output 322 of counter 324 remains low. However, if counter 324 overflows before comparator output 312 goes low, overflow output 322 of counter 324 goes high, indicating that $I_{cap}$ is below the level needed for the regulator output voltage to reach $v_{th}+v_h$ volts in $N_{max}$ cycles of clock source 314. The value of $N_{max}$ is set by the size of counter 324.

Two sample $N_{max}$ calculations are shown in Table 1, for exemplary regulators having different values of $I_{max}$. The coefficient x is arbitrarily picked to be 0.1. In both cases the number of bits in the counter is reasonable, and suitable for integration. A simple ripple counter is sufficient, since such counters have low power dissipation and the counter values $N_{count}$ that produce an overflow condition in counter 316 can approximate $N_{max}$ with sufficient accuracy. Of course, if desired synchronous or other counter types could be employed, including types for which $N_{count}=N_{max}$.

Both calculations assume that the multiplier is designed such that, when $I_{cap}$ is unlimited, $I_{max}$ is equal to or greater than the maximum current needed by the load.

TABLE 1

Calculated values for $N_{max}$ and counter size for two regulator designs, per an exemplary embodiment.

|  | Regulator 1 | Regulator 2 | units |
|---|---|---|---|
| $v_h$ | 0.08 | 0.08 | volts |
| $f_c$ | 3.20E+04 | 3.20E+07 | Hz |
| $C_{load}$ | 2.20E−06 | 2.20E−06 | F |
| x | 0.1 | 0.1 |  |
| $I_{max}$ | 1.00E−06 | 6.00E−03 | A |
| Minimum $I_{cap}$ required | 500E−09 | 3.00E−03 | A |
| $N_{max}$ | 5.63E+04 | 9.39E+03 |  |
| $N_{count}$, the lowest power of 2 value greater than $N_{max}$ | 65536 | 16384 |  |
| number of bits in counter | 16 | 14 | bits |

In Regulator 1, the multiplier is designed to source a maximum of $I_{max}=1$ uA when the supply current is unrestricted. However, the multiplier can source no more than twice $I_{cap}$. As $I_{cap}$ falls below 500 nA $I_{max}$ must also fall, slowing the rate of voltage rise when the multiplier is conducting until counter 324 overflows before it can be reset. In Regulator 1, counter 324 is a 16-bit ripple counter, counting $N_{count}=65536$ counts of the $f_c=32$ kHz clock (2.048 seconds) before overflowing. Therefore, in this regulator counter 324 will overflow, and the detection of an inadequate power source declared, if the regulator output does not rise $v_h=0.08$ V in 2.048 seconds.

Similarly, in Regulator 2, the multiplier is designed to source a maximum of $I_{max}=6$ mA when the supply current is unrestricted. In this case, as $I_{cap}$ falls below 3 mA $I_{max}$ must also fall, slowing the rate of voltage rise when the multiplier is conducting until counter 324 overflows before it can be reset. In Regulator 2, counter 324 is a 14-bit ripple counter, counting $N_{count}=16384$ counts of the $f_c=32$ MHz clock (512 us) before overflowing. Therefore, in this regulator counter 324 will overflow, and the detection of an inadequate power source declared, if the regulator output does not rise $v_h=0.08$ V in 512 us.

Figure 4:
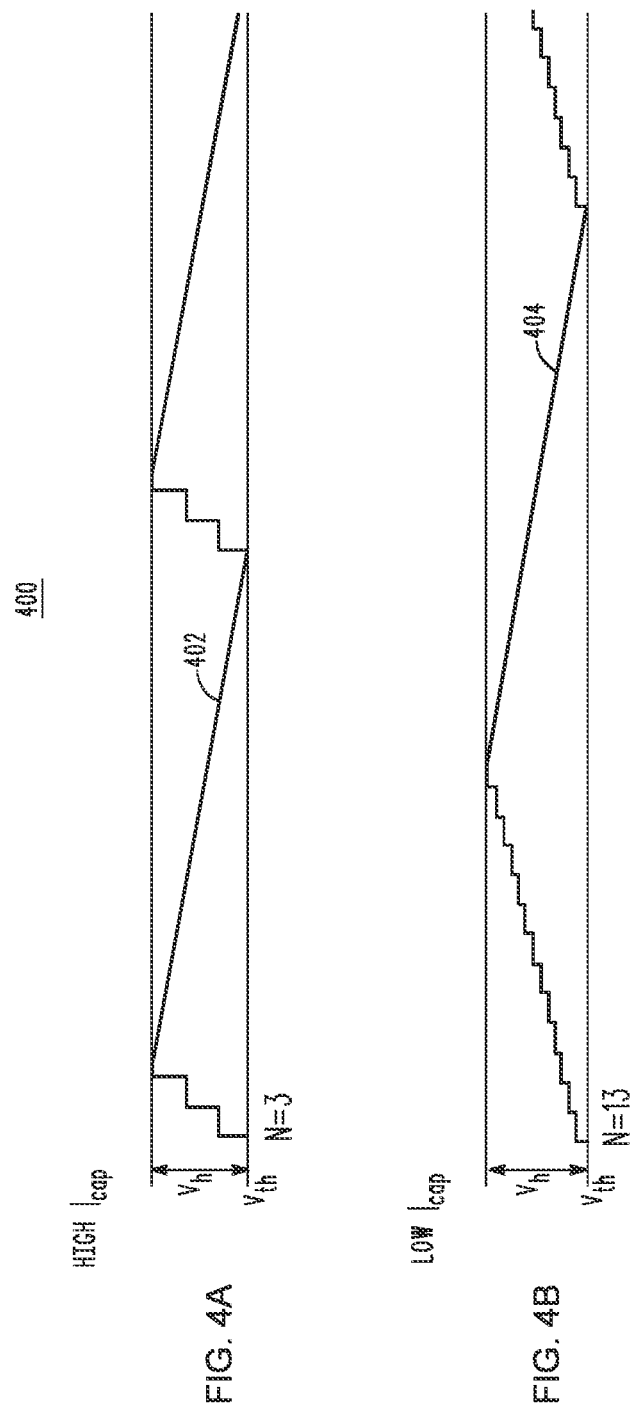
FIGS. 4(A) and 4(B) illustrate examples of operation of an insufficient-supplied power detector, in accordance with various representative embodiments.

Operation of the detector is shown in greater detail in the curves of FIG. 4. In FIGS. 4(A) and 4(B), the clock frequency $f_c$ of the curves 402 and 404 is the same; only the voltage step sizes differ. Note also that, for clarity, the number of steps shown in the Figure is made unusually low.

In the Figure, curve 402 shows the operation of a regulator when the source current is unrestricted. In this case, the multiplier conducts and the regulator output voltage rises rapidly to $v_{th}+v_h$, and then turns off. The voltage then gradually decreases as current is drawn from Capacitor 114 in the current multiplier. When this voltage reaches $v_{th}$, the multiplier conducts again and the cycle is repeated.

Curve 404 shows the case in which $I_{cap}$ is low, limiting the current available to the product. In this case, however, because the current from the source is limited, the voltage step height is smaller, and as a result more clock cycles are needed to reach $v_{th}+v_h$. Counter 324 counts these clock cycles; when it overflows the determination of an insufficient supply is made. Overflow output 322 of counter 324 thereby operates as an insufficient-supply indicator.

Figure 5:
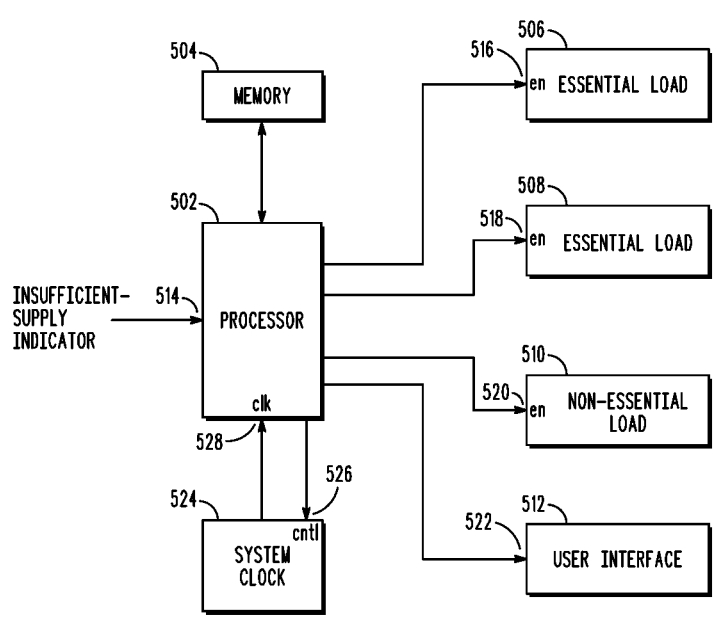
FIG. 5 is a functional block diagram of in which an insufficient-supply indicator may be used to control various loads of a device, in accordance with various representative embodiments.

An insufficient-supply indicator has many uses, some of which are now described with the aid of FIG. 5. In FIG. 5, processor 502 is coupled to the insufficient-supply indicator (e.g., overflow output 322 of counter 324 in FIG. 3) at input 514. Processor 502 is also coupled to memory 504, essential load 506 via enable signal 516, essential load 508 via enable signal 518, non-essential load 510 via enable signal 520, user interface 512 via port 522, and system clock 524 via control signal 526 and clock signal 528.

Couplings between blocks in FIG. 5 may be wireless. In addition, processor 502 may reside on the device, or may not.

In a cellular telephone, essential loads 506 and 508 may be, for example, a Global Positioning System (GPS) receiver and a cellular telephone transceiver, respectively. Non-essential load 510 may be, for example, an audio amplifier for speakerphone use.

In product operation, processor 502 controls essential loads 506 and 508, non-essential load 510, and user interface 512 as instructed by software instructions stored in memory 504. The processor may monitor the insufficient-supply indicator at input 514 by polling input 514, by considering input 514 to be an interrupt, by storing the value of input 514 in a register or memory for later evaluation, or by any other means known in the art.

When an insufficient-supply indication is made, processor 502 executes the instructions for this event stored in memory 504. Processor 502 may, for example, activate its user interface, and send a warning (via a visual display, audible tone, or other means) to the user. Port 522 on user interface 512 may be a two-way port, enabling the user to reply to the warning by instructing processor 502 on desired current-reduction steps (e.g., by turning off or dimming a display backlight).

Processor 502 also may, for example, disable non-essential load 510 via enable input 520, thereby reducing the load current of the product when essential loads 506 and 508 are enabled (load shedding). This would, for example, disable speakerphone use, while still maintaining GPS and conventional telephone capability.

Processor 502 also may, for example, control system clock 524 via control signal 526 so that the frequency of clock signal 528, or the frequency of the clock of other product components (not shown in FIG. 5), is reduced, thereby reducing the product load current. Moreover, processor 502 may selectively reduce a supply voltage of the device in order to reduce product load current.

Processor 502 also may, for example, stagger the operation of essential loads 506 and 508, so that the two are never active simultaneously and the peak load current of the product reduced. In the cellular telephone example, this would stagger the operation of the GPS receiver and the cellular telephone transceiver.

Of course, the insufficient-supply indicator and any loads involved in load-reduction efforts must be coupled to the same supply. If processor 502 and memory 504 are not the object of load-reduction efforts, however (e.g., by reducing the frequency of clock signal 528), they need not be supplied by the same power source as that coupled to the insufficient-supply indicator.

As used herein memory 504 may be any suitable memory technology such as a random access memory (RAM), Read Only Memory (ROM), Flash memory, Electrically Erasable Programmable Read Only Memory (EEPROM), mass storage such as a hard disc drive, floppy disc drive, optical disc drive or may accommodate other electronic storage media, and non-volatile memory (NVM). The memory may be active memory or may permanently reside in ROM, EEPROM or Flash memory, for example.

Processor 502 encompasses a processor, controller, microcontroller unit (MCU), microprocessor, and other suitable control elements. It will be appreciated that embodiments of the invention described herein may be comprised of one or more conventional processors and unique stored program instructions that control the one or more processors to implement, in conjunction with certain non-processor circuits, some, most, or all of the functions described herein. The non-processor circuits may include, but are not limited to, a receiver, a transmitter, a radio, signal drivers, clock circuits, power source circuits, and user input devices. As such, these functions may be interpreted as a method to perform functions in accordance with certain embodiments consistent with the present invention. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Moreover, those skilled in the art will recognize that the present invention has been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, microcontrollers, optical computers, analog computers, dedicated processors and/or dedicated hard wired logic may be used to construct alternative equivalent embodiments of the present invention.

Those skilled in the art will appreciate that a program flow and associated data used to implement the embodiments described above can be implemented using various forms of storage such as Read Only Memory (ROM), Random Access Memory (RAM), Electrically Erasable Programmable Read Only Memory (EEPROM); non-volatile memory (NVM); mass storage such as a hard disc drive, floppy disc drive, optical disc drive; optical storage elements, magnetic storage elements, magneto-optical storage elements, flash memory, core memory and/or other equivalent storage technologies without departing from the present invention. Such alternative storage devices should be considered equivalents.

Various embodiments described herein are implemented using programmed processors executing programming instructions that are broadly described in flow chart form that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

Figure 6:
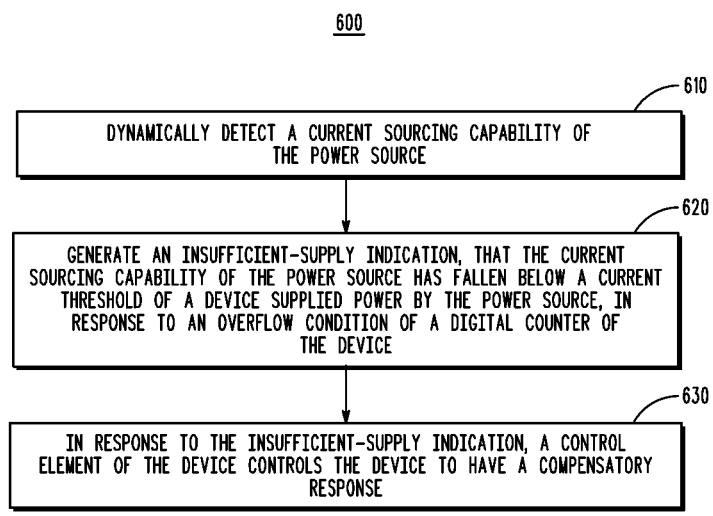
FIG. 6 is a flowchart that illustrates a method of detection, in accordance with various representative embodiments.

Referring now to FIG. 6, flowchart 600 illustrates a method of detecting an inadequate current sourcing capability of a power source. At Block 610, a current sourcing capability of the power source is dynamically detected. Dynamic detection of the current sourcing capability may include monitoring an overflow output of the digital counter of the device, the insufficient-supply indication, and may be performed periodically or near-continuously to provide information concerning the adequacy of the power source as needed.

At Block 620, in response to an overflow condition of a digital counter of the device, an insufficient-supply indication, that the current sourcing capability of the power source has fallen below a current threshold of a device supplied power by the power source, is generated. As previously described, the overflow condition is caused by a current multiplier of the device to which the digital counter is coupled being unable to achieve a threshold voltage within $N_{count}$ cycles of a clock signal used to clock the digital counter.

At Block 630, in response to the insufficient-supply indication, a control element of the device controls the device to have a compensatory response. A compensatory response by the device may be generation of an alert indication, such as a low-battery alert, or it may be action taken, under processor control, to reduce the current load drawn by the device. Selectively reducing the current load of the device may include one or more of selectively shutting down operation of one or more load elements of the device, shutting down the device itself, lowering power consumption utilized by the device (e.g. reducing a supply voltage or a clock speed of the device), and selectively scheduling when functions performed by device occur.

Controlling Power Sources

Power sources frequently have controllable power-sourcing capability. For example, the power-sourcing ability of Zn—O batteries is controlled by the rate oxygen is supplied to the cell, and the power-sourcing ability of fuel cells is controlled by the rate fuel and oxidizer are supplied. The energy from energy-harvesting power sources usually is derived from so-called "waste" energy present in larger systems; however, even in these cases it can be advantageous to control the power-sourcing capability of the source so that the unused waste energy may be used by other harvesting sources. In energy-harvesting systems producing energy from mechanical vibration, for example, the power-sourcing ability can be controlled by adjusting the harvester's frequency of resonance relative to the primary mechanical vibration frequency, or by adjusting the Q (quality factor) of the harvester.

The load requirements of modern electronics can vary dramatically, as devices come in and out of sleep modes, audio and video user interfaces are active, and features are accessed. This dynamic load makes it useful to be able to control the power-sourcing capability of the power source, to maximize efficiency.

Products supplied by variable sources often employ current multipliers (also known as capacitive switching converters and capacitive voltage converters) to convert the voltage presented by a source to a voltage needed by a load. Due to their small physical size and suitability for semiconductor integration, current multipliers are frequently employed in this application.

Discussed above was how a counter may be employed with a current multiplier configured as a voltage regulator, to detect an insufficient-supply condition from a source. With this detection, a controller may then control a load on the source, such that the current required for the load was less than or equal to the current available from the source.

Another possibility is that the source, rather than the load, may be controlled in response to detection of an oversupply condition of the power source in which too much power is available to the load device or an undersupply condition of the power source in which insufficient power is available to the load device.

As will now be described, a device embodying the power source control capabilities described herein may be considered to have a detection element operable to dynamically detect a power sourcing capability of the power source; and a control element operable to monitor the power sourcing capability of the power source and to control the power source to effect a change in the power sourcing capability of the power source in response to a determination that the detected power sourcing capability of the power source is in violation of a threshold value. The device may further have a counter, with the detection element operable to determine a counter value of the counter at the occurrence of a transition state of a control signal generated by the device; and the control element operable to change the power sourcing capability of the power source based, at least in part, on the determined counter value.

In accordance with further embodiments, the control element of the device is operable to determine whether the detected power sourcing capability of the power source is representative of an oversupply condition of the power source in which too much power is available to the device; and responsive to determination of the oversupply condition of the power source, the control element is operable to control the power source to lower its power sourcing capability to the device. In such as device, the control element may be further operable to determine whether the detected power sourcing capability of the power source is representative of an undersupply condition of the power source in which insufficient power is available to the device; and responsive to determination of the undersupply condition of the power source, the control element is operable to control the power source to increase its power sourcing capability to the device.

In accordance with other embodiments, a control element operable to determine whether the detected power sourcing capability of the power source is representative of an undersupply condition of the power source in which insufficient power is available to the device; and responsive to determination of the undersupply condition of the power source, the control element is operable to control the power source to increase its power sourcing capability to the device. In such as device, the control element may be further operable to determine whether the detected power sourcing capability of the power source is representative of an oversupply condition of the power source in which too much power is available to the device; and responsive to determination of the oversupply condition of the power source, the control element is operable to control the power source to lower its power sourcing capability to the device. In response to determination of the undersupply condition of the power source, the control element may cause an alert indication to be generated.

As previously discussed, the detection element may have a current multiplier, operable as a voltage regulator and having a control signal, that is coupled to the power source and receives a clock signal; and a state machine with a counter, clocked by the clock signal and reset by the control signal, the state machine operable to generate a power source control signal, where the counter is clocked by the clock signal until a transition of the control signal, at which time a counter value of the counter indicates whether the oversupply condition of the power source exists and the power source control signal controls the power source based, at least in part, on the counter value. As has been illustrated, the detection element may further include a comparator, coupled to the current multiplier, that generates the control signal.

Where an overflow condition of the counter prior to transition of the control signal indicates the presence of the undersupply condition of the power source and in response to the overflow condition of the counter, the power source control signal controls the power source to increase its power sourcing capability to the device. The counter is reset by the control signal after occurrence of the overflow condition.

Figure 9:
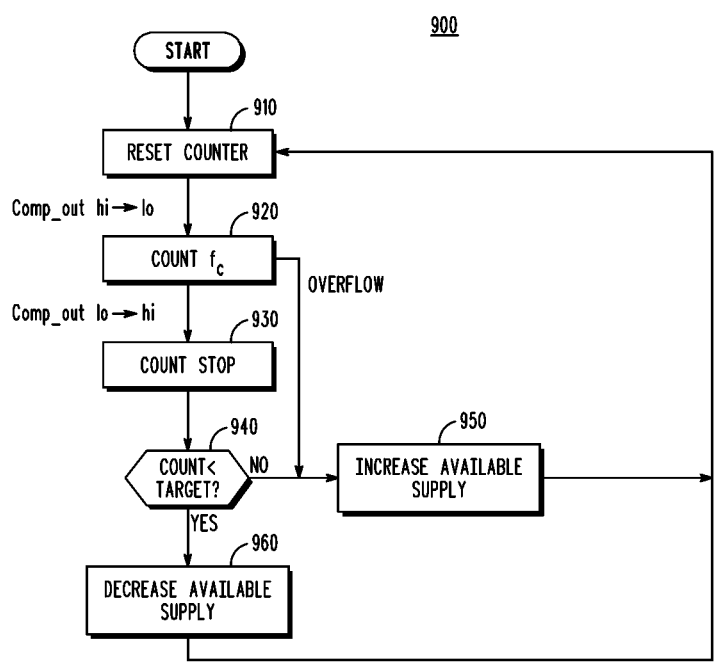
FIGS. 9 and 10 are flowcharts that illustrate methods of dynamically controlling the power sourcing capability of a power source that supplies power to a device, in accordance with various representative embodiments.
Figure 10:
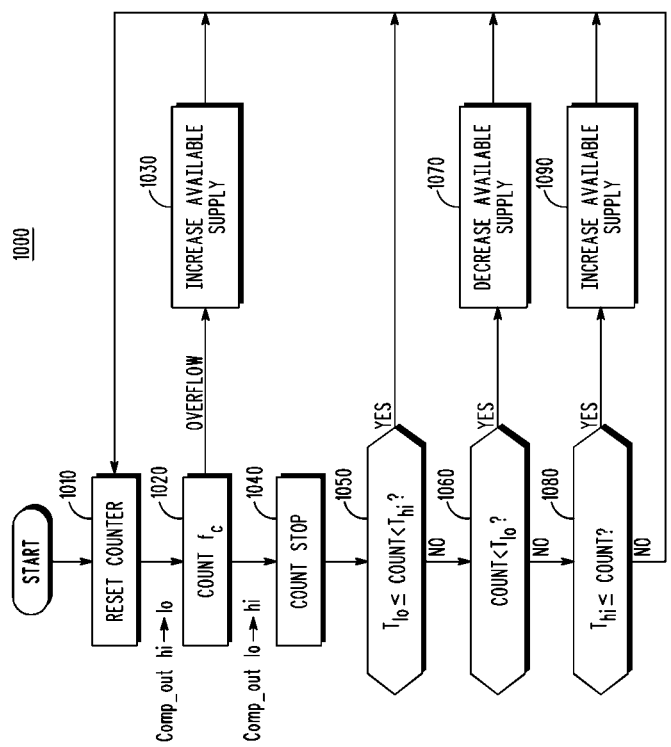

As will be further described, upon a first transition of the control signal, from a first state to a second state, the counter is clocked by the clock signal until a second transition of the control signal, from the second state to the first state, at which time the counter is no longer clocked by the clock signal and the state machine evaluates the counter value of the counter. If it is determined that the counter value is between first and second threshold values, the state machine does not generate the power source control signal and no change is made to the power sourcing capability of the power source. If it is determined that the counter value of the counter is less than a threshold value, the detected power sourcing capability of the power source is representative of the oversupply condition and the power source control signal generated by the state machine is operable to cause the power source to lower its power sourcing capability to the device. The counter is reset after the second transition of the control signal from the second state to the first state. As is illustrated in the flows of FIGS. 9 and 10, the counter is in a reset state until the first transition of the control signal from the first state to the second state at which time the counter is clocked by the clock signal.

Figure 7:
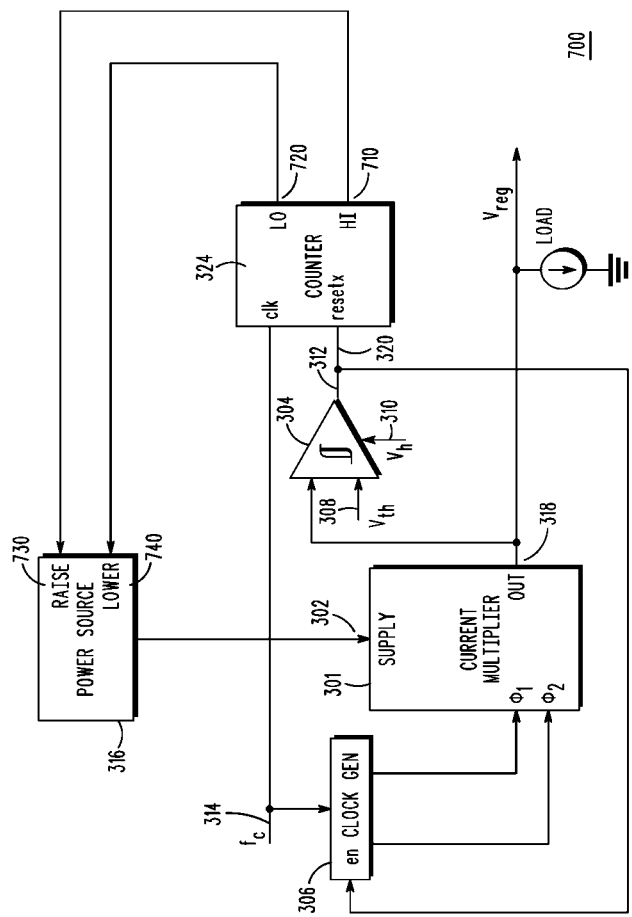
FIG. 7 is a block diagram of a system of a power source and a device provided power by the power source, in accordance with representative embodiments.

As shown in block diagram 700 of FIG. 7, the power source 316 may be controlled via raise input 730 and lower input 740 to increase its output, or to decrease its output, in response to the counter value that exists in the counter 324 at the time the counter is reset by the current multiplier control signal 320. If the available supply is significantly greater than that drawn by the load, the current multiplier 301 will turn off quickly, leading to a low counter value at reset and the determination that the power source 316 may lower its available power. Conversely, if the available supply approaches that drawn by the load, the current multiplier 301 will continue to run for an extended period, leading to a high counter value (possibly an overflow) at reset and the determination that the power source must increase its available power.

In this way the power source 318 itself may be regulated to supply only the power needed by the load.

Figure 8:
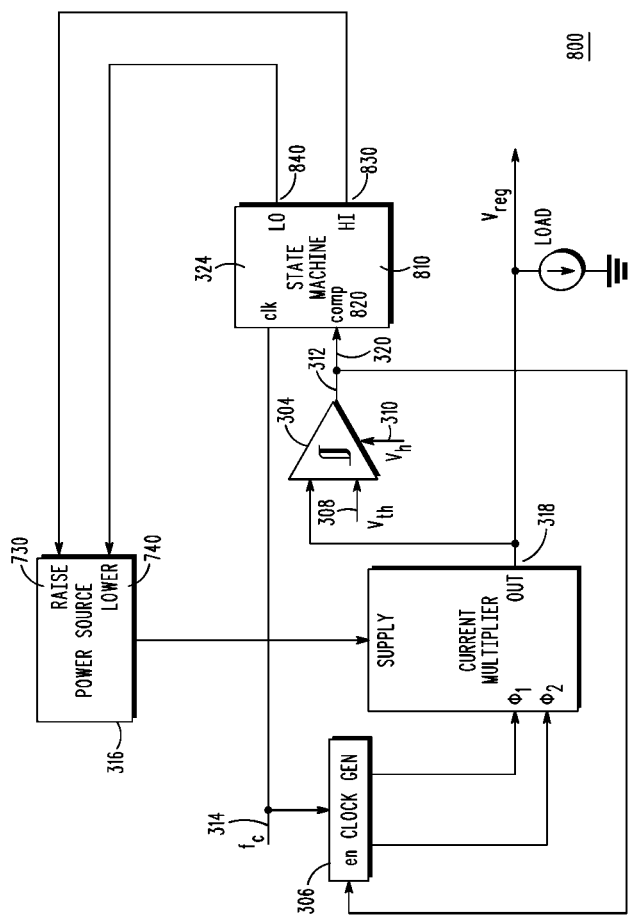
FIG. 8 is a block diagram of a system of a power source and a device provided power by the power source, in accordance with various other representative embodiments.

Upon further review, the controlled power source system can be improved if the counter block is replaced by a state machine 810 having a counter, as shown in block diagram 800 of FIG. 8. The power source can be controlled without having to wait for the counter to overflow. A state machine allows the use of one or more threshold values to which a counter value may be compared to determine if, and how, the power source 316 should be controlled in response to insufficient-supply detection.

The state machine 810 takes the clock signal 314 and comparator output as inputs, including at comparator input 820, and outputs control signals LO signal 840 and HI signal 830 for the power source 316 as shown. The control algorithm encoded in the state machine can take many forms; two examples are shown in the flowcharts of FIG. 9 and FIG. 10.

At the start of the algorithm shown in flowchart 900 of FIG. 9, at Block 910 a counter of the state machine stays in reset until there is a negative-going (high-to-low) transition of the comparator output. At this time, the counter begins to count the $f_c$ clock at Block 920, counting until there is a positive-going (low-to-high) transition of the comparator output. At this point the counter is stopped at Block 930. (If the counter overflows before the positive-going transition, the available supply is increased, if possible, the counter is reset, and the process repeats.) The contents of the counter are then evaluated at Block 940.

If the counter value is less than a threshold, the available supply is decreased at Block 960, if possible, the counter is reset at Block 910, and the process repeats. If the counter value is greater than, or equal to, a threshold, the available supply is increased at Block 950, if possible, the counter is reset at Block 910, and the process repeats.

At the start of the algorithm shown in the flowchart 1000 of FIG. 10, at Block 1010 a counter of the state machine stays in reset until there is a negative-going (high-to-low) transition of the comparator output. At this time, the counter begins to count the $f_c$ clock at Block 1020, counting until there is a positive-going (low-to-high) transition of the comparator output. At this point the counter is stopped at Block 1040. (If the counter overflows before the positive-going transition, the available supply is increased at Block 1030, if possible, the counter is reset at Block 1010, and the process repeats.) The contents of the counter are then evaluated at Blocks 1050, 1060, and 1080.

If the counter value is between two threshold values, $T_{lo}$ and $T_{hi}$, as determined at Block 1050, no change is made to the available supply, the counter is reset at Block 1010, and the process repeats. If the counter value is less than $T_{lo}$, as determined at Block 1060, the available supply is decreased at Block 1070, if possible, the counter is reset at Block 1010, and the process repeats. If the counter value is greater than $T_{hi}$, as determined at Block 1080, the available supply is increased at Block 1090, if possible, the counter is reset at Block 1010, and the process repeats. In the illogical (error) condition that none of these conditions is true, no change is made to the available supply, the counter is reset, and the process repeats.

In both of these examples of FIGS. 9 and 10, the increases and decreases in the available supply may be fixed values, or values based at least in part on the difference between a counter value and a threshold.

It can be seen from the above, that in accordance with various aspects of the present disclosure a method of dynamically controlling the power sourcing capability of a power source that supplies power to a device is provided, including: detecting a power sourcing capability of the power source; and in response to determining that the detected power sourcing capability is in violation of a threshold value, the device dynamically controlling the power source to effect a change in the power sourcing capability of the power source. Further, the method may include: determining a counter value of a counter of the device at the occurrence of a transition state of a control signal generated by the device; and the device controlling the power source to change the power sourcing capability of the power source based, at least in part, on the determined counter value.

In accordance with further aspects of the present disclosure, a method of dynamically controlling the power sourcing capability of a power source that supplies power to a device is provided, including: detecting a power sourcing capability of the power source; determining whether the detected power sourcing capability of the power source is representative of a condition of the power source in which too much power is available to the device, which may be an oversupply condition or an undersupply condition; and in response to the condition of the power source, the device dynamically controlling the power source to change its power sourcing capability to the device in accordance with the condition. As described, in response to an oversupply condition of the power source, the device will dynamically control the power source to lower its power sourcing capability to the device. Conversely, in response to an undersupply condition of the power source, the device will dynamically control the power source to increase its power sourcing capability to the device.

Switching Regulator Overload Detector

As described above, there are further embodiments in which the voltage comparator signal is used to close the regulator switches as an indication of additional current demand upon the regulator. Accordingly, various additional methods, apparatus, and devices described herein provide for the detection of insufficient supplied power provided to a device, and also for reaction by the device and/or the power source to the detection of insufficient supplied power. More particularly, in response to determining that a sample density of comparison values, representative of the current sourcing capability of the power source of a switching regulator, exceeds a selectable density threshold and that an overload condition therefore exists, an insufficient-supply indication is generated. As previously discussed, an insufficient-supply indication indicates that the current sourcing capability of the power source has fallen below a current threshold of a device supplied power by the power source.

These various embodiments identify an overload condition as an excessive sample density of positive comparator signal samples during a sample window; an overload condition of the power source of a switching regulator results when there is a demand for current that exceeds the capacity of the power source and reflects an overload condition. A unique feature of this approach, as compared to the one previously described, is that the comparator signal does not have to be continuous during that window to be considered an overload. The sample window may be divided into sub-windows, each with its own sample counter. The sample density is the number of sampling cycles in which a comparator signal high-state is detected, summed across all sub-windows by an adding mechanism of the detector. The counting mechanism of the detector counts positive comparator signal samples occurring within one or more sub-windows and may be adjusted as new samples within a sampling cycle are detected; for example, older sub-windows sample counters may be cleared and used for newer samples. The number of samples or sampling cycles, the sample sub-window size or duration, and the number of sub-windows used can be software-programmable or otherwise selectable. If just one sample window is used, the size of the sample window and the number of samples or sampling cycles for the sample window is likewise selectable or programmable.

An advantage of this is that this approach is more responsive to an overload condition, and that it doesn't restart its search for each comparator signal high-state. The use of positive comparator signal sample detection during sub-windows, combined with the programmable density threshold, sub-window size, and sub-window number, allows the user to customize the detection to meet their power stability needs and power usage profiles.

The power optimization techniques previously described, which include responding to an oversupply as well as an undersupply, are considered to be enhanced by these additional enhancements as well.

A preferred embodiment may be implemented with software-configurable hardware. However, an all-hardware or all-software implementation is also considered. Additionally, an implementation that features a continually "sliding" window, in which old samples are discarded one at a time instead of by entire sub-windows, is also contemplated. In this "sliding" window example, large amounts of sample data would have to be managed.

Referring now to the block diagram 1100 of FIG. 11, the state of low voltage indicator, output signal 1135 of comparator 1130, identifies the condition in which the regulator output of switching regulator 1120 falls below a reference voltage of reference voltage source 1110 and the embodiments described herein describe a method for detecting the condition in which the regulator output of switching regulator 1120 is observed to be lower than the reference voltage of reference voltage source 1110 for greater than a specified (programmable) threshold duration within a sample window of time of a specified (programmable) duration, or a (programmable) number of sample sub-windows, each sub-window of a specified (programmable) duration. This low voltage, insufficient-supply condition, which may be considered an overload condition, is detected by detector 1140, in a manner such that corrective, compensatory action may be taken. The observed duration may be a single continuous occurrence in which the regulator output is less than the voltage reference, or an accumulation of shorter durations, separated by periods in which the comparator does not indicate the low voltage condition. A counting mechanism of detector 1140 is provided that increments or decrements at periodic intervals, if, at those intervals, comparator 1130 indicates a low regulator voltage with respect to the reference; the counting mechanism therefore provides an implementation having down-sample counters, as well as an implementation having up-sample counters as described herein. If the accumulated count of the counting mechanism, the sample density, crosses the specified density threshold (the "set point" as shown in the embodiment of FIG. 12) within the specified time duration, an insufficient-supply indication of this occurrence overload indicator signal 1150 (also labeled "overload indicator 1150" in the embodiments illustrated in FIGS. 12 and 16) is generated as described above. As will be readily understood, when the counting mechanism is comprised of counters that decrement in response to occurrence of a positive comparator signal sample, crossing the specified density threshold occurs when the sample density is less than the density threshold. Conversely, when the counting mechanism is comprised of counters that increment in response to occurrence of a positive comparator signal sample, crossing the specified density threshold occurs when the sample density exceeds the density threshold.

Figure 12:
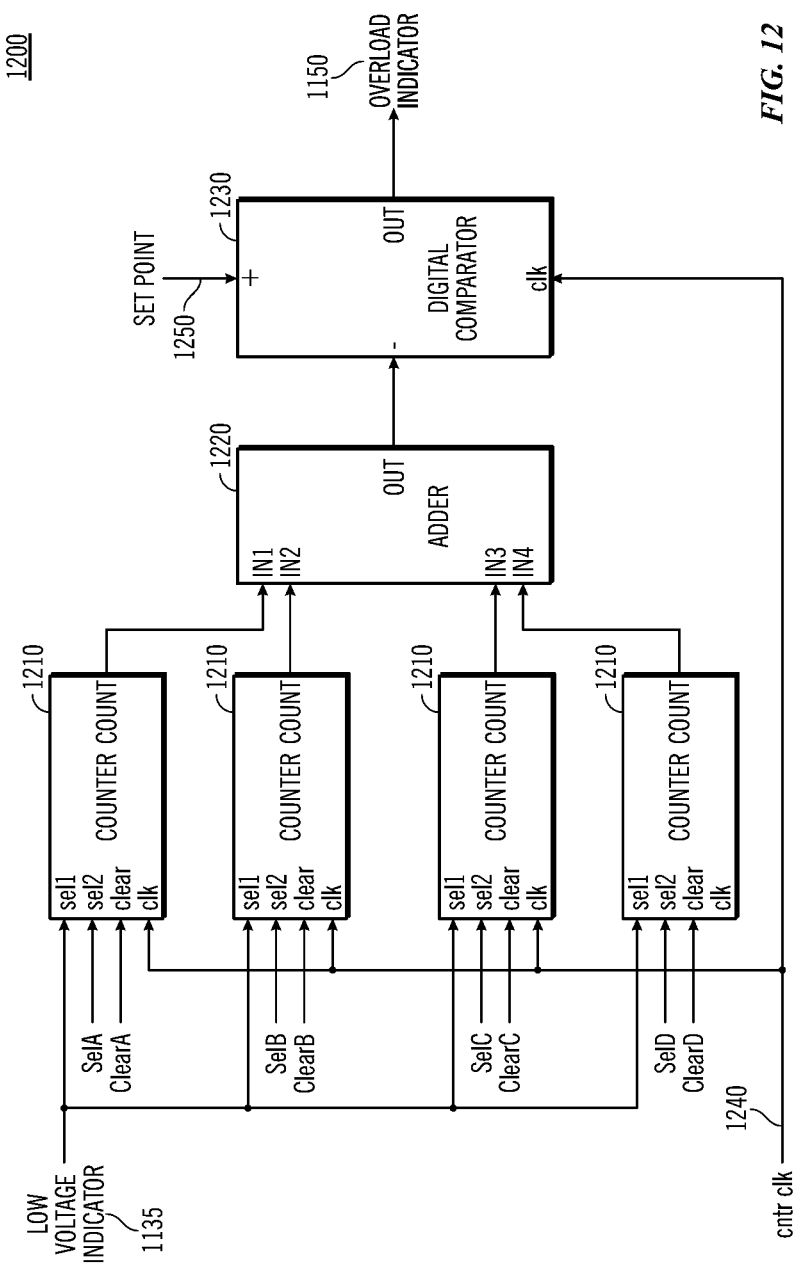
FIG. 12 is a block diagram of a first type of dynamic detection element, in accordance with various representative embodiments.
Figure 13:
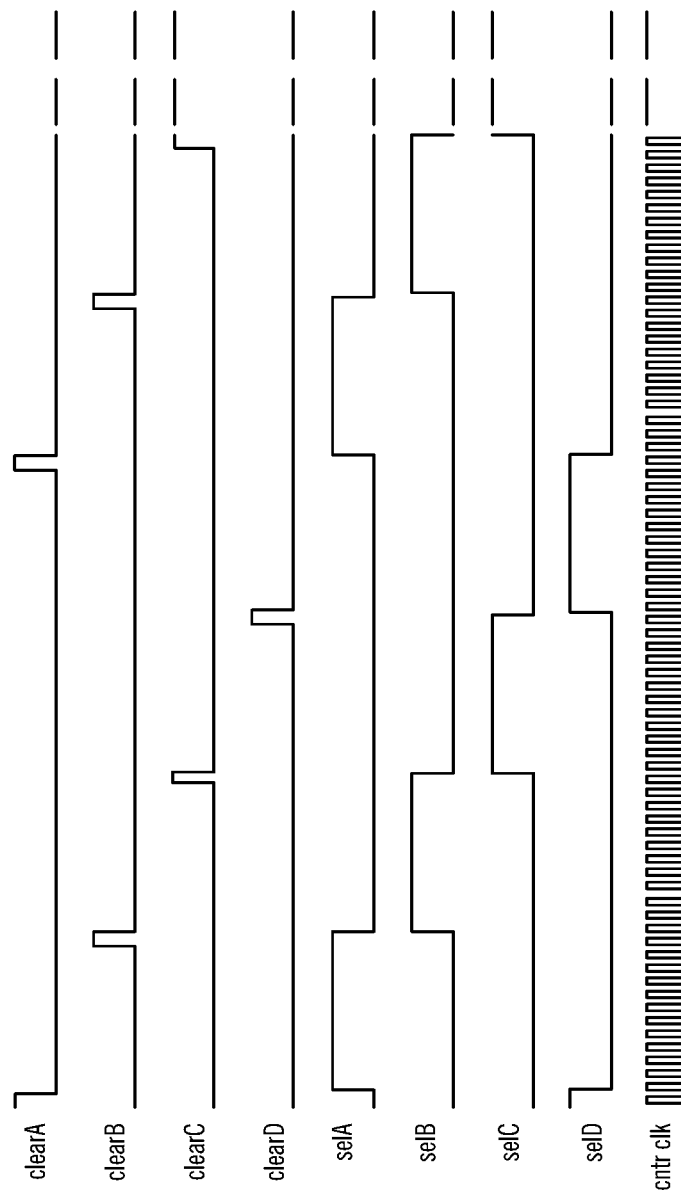
FIG. 13 is a signal diagram of the dynamic detection element of FIG. 12, in accordance with various representative embodiments.

In accordance with a first embodiment 1200 of the detector, shown in FIG. 12, the counting mechanism comprises a selected (programmable) number of counters 1210, up to 4, in this particular example, enabled one at a time, in a rotating (round-robin) order. The enabled counter increments at each periodic interval in which the low voltage condition is detected; an insufficient-supply indication is provided by overload indicator signal 1150 at the output of detector 1200. The timer delays for a specified duration. At regular intervals (such as every clock cycle, cntr clk 1240), the sum of counts of all selected counters selected by select signals such as selA, selB, selC, selD, as determined by Adder block 1220, is compared to the setpoint threshold 1250 by a comparator, such as Digital Comparator 1230 as indicated in the drawing. If this setpoint threshold 1250 is exceeded, an overload condition is considered to have occurred as reflected in the output signal overload indicator 1150. While the threshold is not exceeded, the selected counter remains enabled until the timer reaches its programmed delay, after which the selected counter is halted, and the next counter in the sequence is selected via its sel signal, cleared via its clear signal, and thus enabled for counting. The timer is also cleared and restarted. The count and compare process then continuously repeats in this embodiment. As previously discussed, the enabled counter may also decrement at each periodic interval in which the low voltage condition is detected. In this case, if comparison of the sum of counts of all selected counters is less than setpoint threshold 1250, an overload condition is indicated by overload indicator 1150. A signal diagram 1300 of this embodiment of the detector is shown in FIG. 13.

Figure 14:
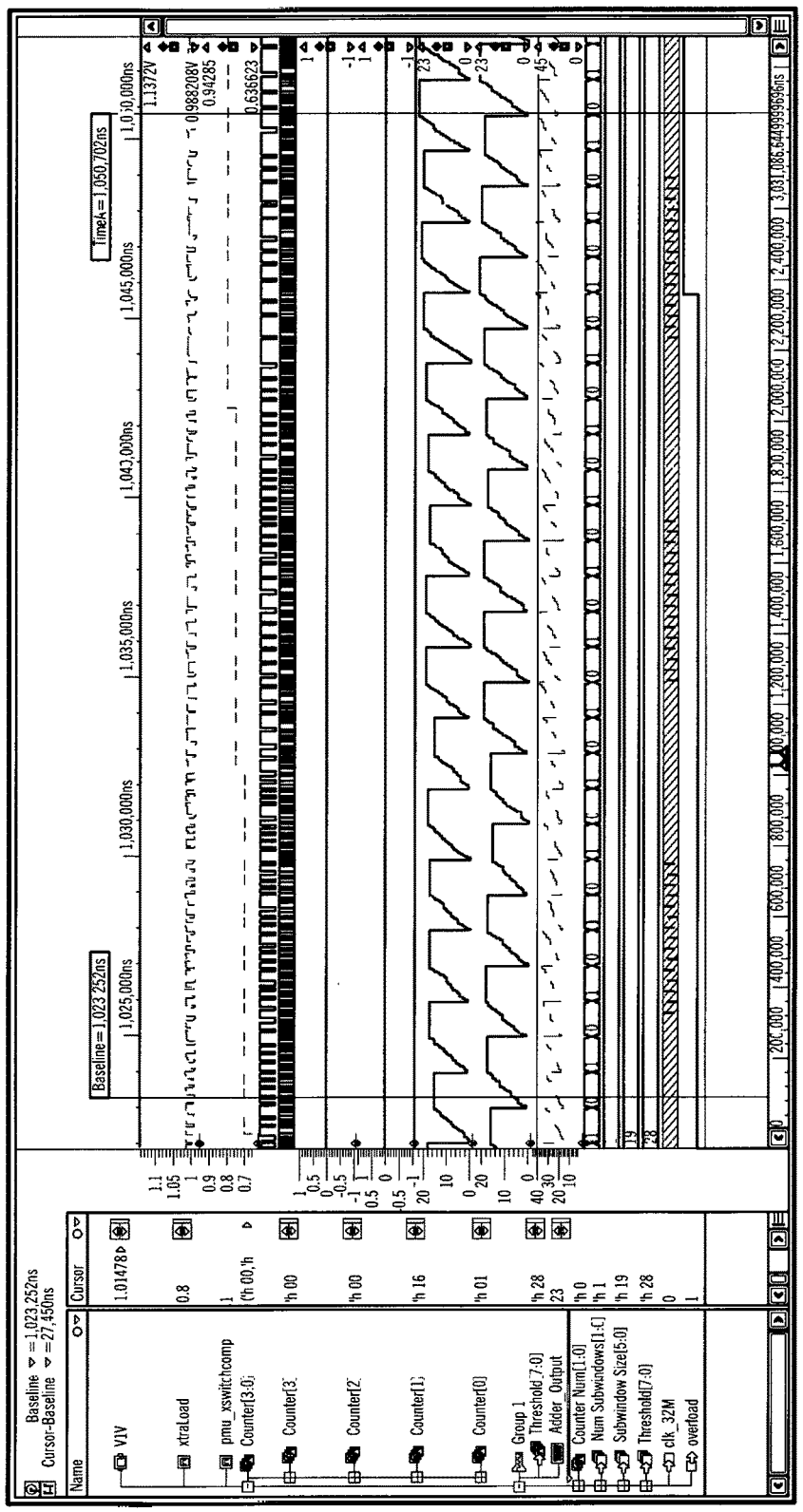
FIGS. 14 and 15 are waveform plots that illustrate the use of two and four sub-windows, respectively, in accordance with various representative embodiments.
Figure 15:
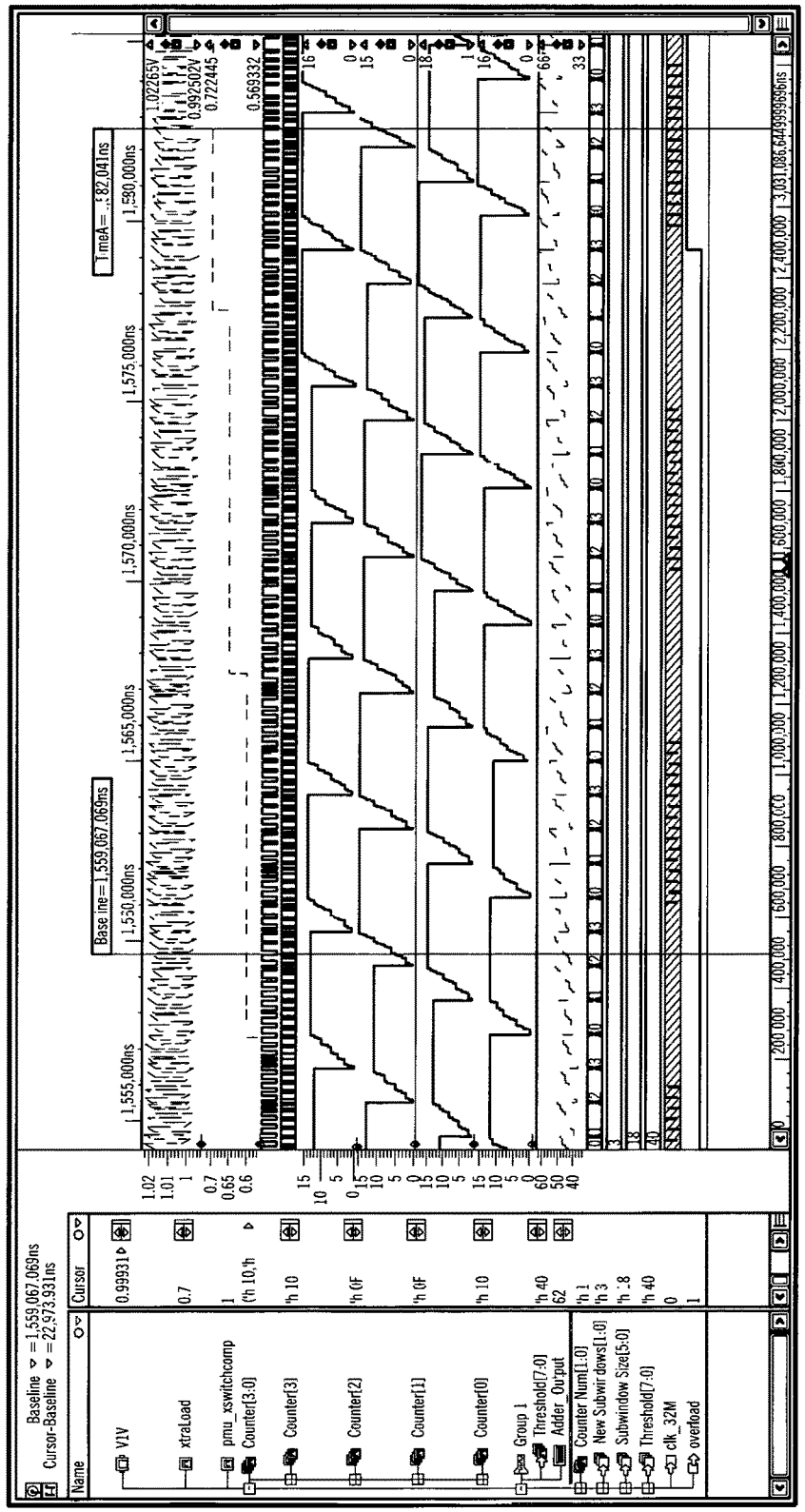

Referring now to FIGS. 14 and 15, two additional waveform plots 1400 and 1500, respectively, illustrate the use of two and four sub-windows, respectively. It can be seen in these waveform plots that the "Adder_Output" trace representative of the "out" terminal of the Adder block 1220 in the diagram of FIG. 12 is plotted on top of the "threshold" representation "Threshold[7:0]". When the total Adder output reaches the threshold, "overload" gets asserted as shown. Also, it can be seen that both waveform plots, the Adder output waveform "Adder_Output" saws up and down as individual sub-windows are cleared.

Figure 16:
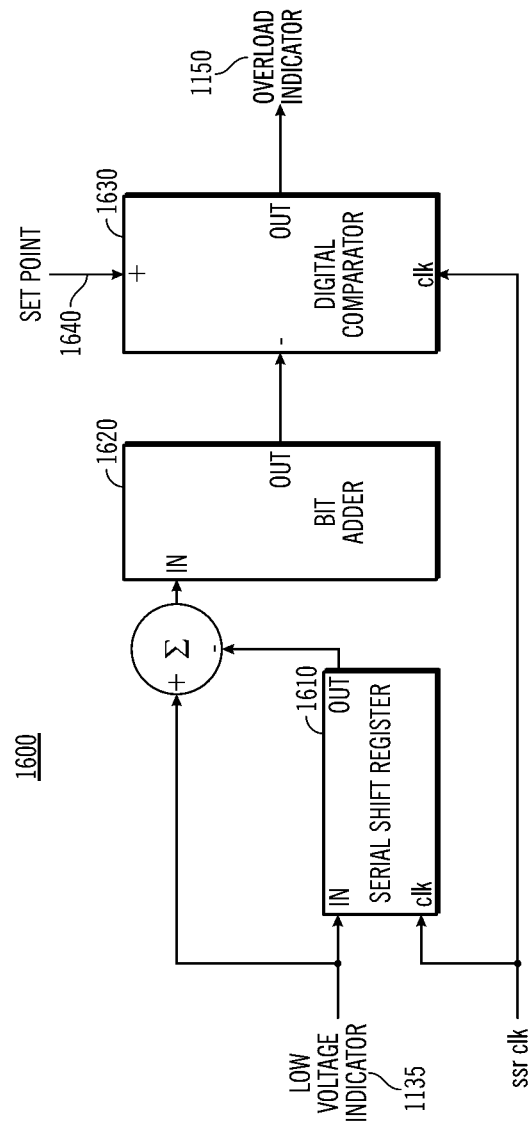
FIG. 16 is a block diagram of a second type of dynamic detection element, in accordance with various representative embodiments.

Referring now to an alternate embodiment of the detector 1600 of FIG. 16, a shift register, serial shift register 1610, of a length equal to the specified window duration, may be employed and low voltage indicator 1135, the output of Comparator 1130, is sampled and stored at periodic intervals. In this alternate embodiment, the counting mechanism is a Bit Adder 1620. If, at each interval, the sampled value entering the shift register 1610 is identical to the oldest value (that exiting the shift register), then the Bit Adder value remains unchanged. If, instead, the sampled value indicates a low voltage while the oldest value does not, the Bit Adder value is incremented. If the opposite conditions exist, then the value is decremented. A still further embodiment in which the increment and decrement functions of the Bit Adder 1610 are reversed is contemplated. In this particular implementation of FIG. 16, if the Bit Adder value crosses the setpoint threshold 1640, the overload condition is considered to have occurred and is reflected in overload indicator signal 1150. Implementation of this alternate embodiment of the detector 1600 may result in a larger gate-count than that described in connection with the first embodiment of FIG. 12.

Converter Overload Detection
System Theory of Operation

Figure 11:
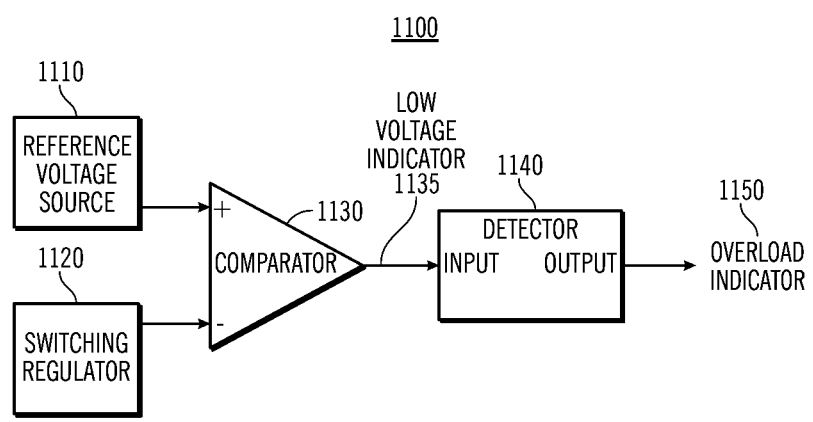
FIG. 11 is a system block diagram, in accordance with various representative embodiments.
Figure 17:
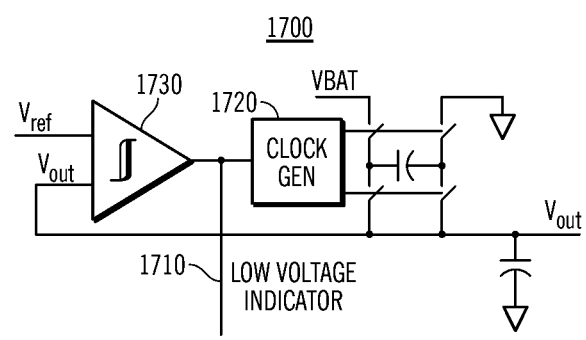
FIG. 17 is a switched DC-DC converter, in accordance with various representative embodiments.

The switched DC-DC converter 1700 shown in FIG. 17 is a potential embodiment of the "Switching Regulator" block 1120 in FIG. 11 and illustrates a current doubling voltage divider of a common type (see B. Kormann, "High-Efficiency, Regulated Charge Pumps for High Current Applications", Unitrode Design Seminar, 2001.) VBAT is an input voltage to be converted to an output voltage Vout. A pulse-skipping regulation scheme similar to that described in the cited work may be employed. The output voltage Vout of FIG. 17 is compared to a reference vref as shown in the block diagram 1100 of FIG. 11. The comparator output signal 1710 (labelled "low voltage indicator" in this figure) enables or inhibits the clock signals to the switches, and also comprises the "Low Voltage Indicator" signal shown in FIG. 11.

The comparator output 1710 contains information about the state of the relative loading on output voltage Vout. If the load demand is high, the comparator 1730 will keep the clock generation provided by clock generator 1720 enabled more often. For lower loading, the clock generation will not need to be enabled as often. Thus, by observing the low voltage indicator signal 1710 over time, the ability of the switcher to support the required system load can be assessed. Timely action can be taken to either shed loads or enable other power generation in parallel to assist or take over generation of output voltage Vout.

Switcher Overload State Machine

Figure 18:
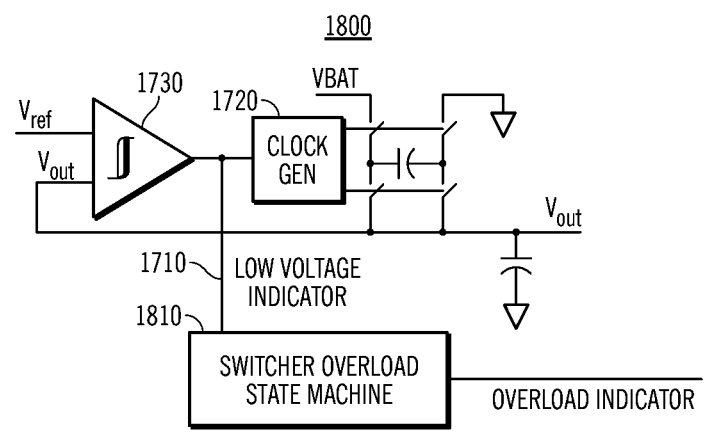
FIG. 18 is a block diagram in which the status of the switched DC-DC converter of FIG. 17 is monitored, in accordance with various representative embodiments.

The embodiment of FIG. 18 illustrates a separate circuit, included to monitor the status of the switched converter of FIG. 17, that can be left on with little power consumption penalty. The configurable state machine, shown as Switcher Overload State Machine 1810, continuously samples the low voltage indicator signal 1710 of the DC-DC converter to determine the relative loading of the converter. In this context, the load on the converter is expressed as a fraction of the maximum supportable load under the conditions present at that time. Thus, as conditions such as temperature or input voltage change, the maximum supportable load also changes.

The embodiment of FIG. 18 samples the converter low voltage indicator signal 1710 at each edge of a system clock. Samples are stored in several contiguous "sub-windows" that are configurable in length and number, as has been described. When the number of positive samples taken from low voltage indicator signal 1710 in a set of sub-windows exceed a threshold, an overload condition is detected. The threshold as a fraction of the maximum load is simply a number of positive samples divided by the total number of samples accumulated (total window length), and is configurable, as is the number of sub-windows and the size of each sub-window. Together these configuration options provide a very flexible load detection system that can be optimized for specific use cases with varying power source capabilities, power stability needs, and power usage profiles.

Figure 19:
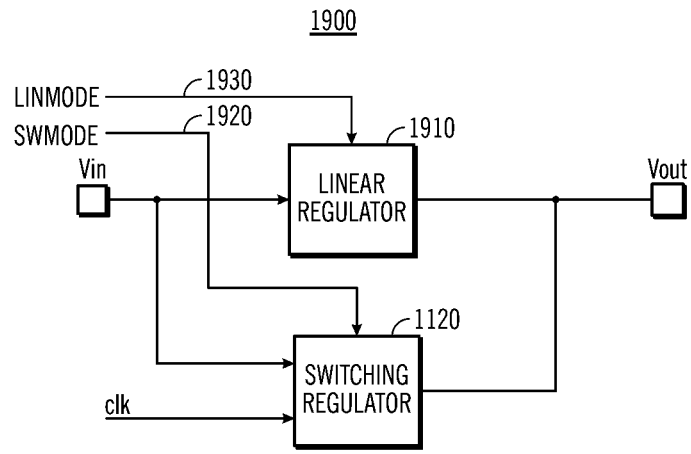
FIG. 19 is a block diagram that illustrates that a switching regulator and a linear regulator can each be selectively enabled and disabled in accordance with detection of an overload condition associated with an insufficient-supply, in accordance with various representative embodiments.

As has been previously discussed, timely action may include shedding loads in response to an overload condition. Additionally, timely action may also include enabling other power generation in parallel to assist or take over generation of output voltage Vout. Referring now to FIG. 19, in accordance with certain example implementations, the switching regulator 1120 may be placed in parallel with a linear regulator 1910. Switching regulator 1120 in this example is controlled by a switching mode control signal 1020 while linear regulator 1910 is controlled by a linear mode signal 1930 as shown, and these control signals may be used to selectively enable and disable regulators 1120 and 1920 in accordance with detection of an overload condition associated with an insufficient-supply.

By way of example and not limitation, when an overload condition is detected, the state machine may automatically respond by activating the linear regulator 1920 that is in parallel with the switched DC-DC converter (shown in FIG. 17) of switching regulator 1120. Consider an example in which linear regulator 1910 may have a higher maximum load and a lower minimum input voltage than switching regulator 1120. Since in this example linear regulator 1910 may require some time to start up before it can take over the duty of supplying power to the load, the switched converter of switching regulator 1120 is left on for a while. When switcher overload state machine 1810 finally disables the switched converter, the output signal Vout is de-asserted to indicate that an overload condition was detected, at which time appropriate action can be taken.

Figure 20:
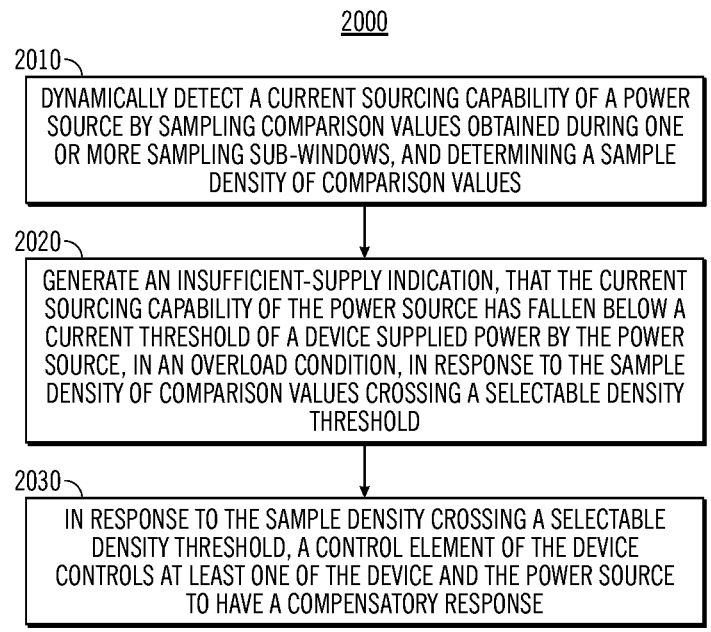
FIG. 20 is a flowchart that illustrates a method of dynamically detecting an overload condition of a power source, in accordance with various representative embodiments.

Referring now to the flowchart 2000 of FIG. 20, a method of detection, in accordance with the various additional representative embodiments discussed above, is presented. At Block 2010 of the flow, a current sourcing capability of a power source is dynamically determined by sampling comparison values obtained during one or more sampling sub-windows, and determining a sample density of comparison values, as has been described. At Block 2020, an insufficient-supply indication is generated responsive to a sample density of comparison values crossing a selectable density threshold. The insufficient-supply indication is that the current sourcing capability of the power source has fallen below a current threshold of a device supplied power by the power source. Next, at Block 2030, in response to the sample density crossing the selected density threshold, a control element of the device controls either or both of the device and the power source to have a compensatory response to the overload condition.

Therefore, in accordance with certain embodiments of the present disclosure described herein, there are provided various methodologies for determining the adequacy of the current sourcing capability of a power source, including: a method of determining the adequacy of the current sourcing capability of a power source, comprising: dynamically detecting a current sourcing capability of the power source by sampling comparison values obtained during one or more sampling sub-windows and determining a sample density of comparison values; generating an insufficient-supply indication, that the current sourcing capability of the power source has fallen below a current threshold of a device supplied power by the power source in an overload condition, in response to the sample density of comparison values crossing a selectable density threshold; and in response to the sample density of comparison values crossing the selectable density threshold, a control element of the device controlling one or more of the device and the power source to have a compensatory response. In response to the sample density of comparison values crossing the selectable density threshold, the control element may: control the device to generate an alert indication; control the device to selectively reduce the current load utilized by the device; and control the power source to increase its power sourcing capability to the device.

Also included is a method for identifying an overload condition of a power source, comprising: dynamically detecting a positive comparator signal sample within a sample window of time when an output voltage of the power source falls below a reference voltage for a duration that exceeds a threshold duration; determining a sample density of the positive comparator signal samples detected during the sample window, where the sample density is the number of sampling cycles in which a positive comparator signal is detected; and determining whether the sample density of positive comparator signal samples crosses a density threshold and is representative of an overload condition of the power source and if so, generating an insufficient-supply indication. Detecting may be performed by a counting mechanism of a detector coupled to the power source, such as a sample counter of the sample window. The sample density of positive comparator signal samples crosses the density threshold either when the sample density exceeds the density threshold or when the sample density is less than the density threshold. As has been previously discussed, the density threshold, a number of sampling cycles, the size of the sample window, and the number and size of the sampling sub-windows are selectable. In the examples discussed, embodiments using two and four sub-windows are disclosed.

Further, in accordance with certain additional embodiments of the present disclosure, there is provided a device that is provided power by a power source, with the device having a dynamic detection element of the device operable to dynamically detect a current sourcing capability of a power source and generate an insufficient-supply indication when the current sourcing capability of the power source has fallen below a current threshold of the device, where the detection element comprises: a counting mechanism that counts positive comparator signal samples occurring within one or more sample sub-windows; an adding mechanism coupled to the counting mechanism that sums the number of positive comparator signal samples occurring within the one or more sub-windows to determine a sample density of the detected positive comparator signal samples; and a comparator that compares the determined sample density of the detected positive comparator signal samples to a density threshold and that, responsive to the sample density of the detected positive comparator signal samples exceeding the density threshold, generates the insufficient-supply indication.

As has been described, the counting mechanism may either increment or decrement in response to occurrence of positive comparator signal samples within the sub-window associated with the counter. The counting mechanism may comprise a plurality of selectable sample counters that each count positive comparator signal samples occurring within an associated sub-window of a plurality of sub-windows and where the adding mechanism is an adder, as shown in FIG. 12. The counting mechanism may also be a serial shift register of a length determined by specified window duration and the adding mechanism a bit adder whose bit adder value is incremented or decremented in response to a positive comparator signal sample and where in response to determining that a bit adder value has crossed a setpoint threshold the comparator generates the insufficient-supply indication, as described in connection with FIG. 16.

Further, the device may comprise a control element operable to monitor the insufficient-supply indication and, in response to generation of the insufficient-supply indication by the detection element, to control the device to have a compensatory response to the insufficient-supply indication or controls the power source to have a compensatory response to the insufficient-supply indication. In response to the sample density of the detected positive comparator signal samples exceeding the density threshold, the control element may control the power source to increase its power sourcing capability to the device. The control element, in response to the sample density of the detected positive comparator signal samples exceeding the density threshold, may also cause an alert indication to be generated and selectively reduces the load current drawn by the device, such as by selectively shutting down operation of at least one load element of the device that draws load current when operational, by selectively lowering power consumption utilized by the device, and by selectively scheduling the occurrence of at least one function of the device. As has been discussed, the control element of the device may selectively shut down a display backlight load element of the device or an audible user feedback load element of the device, selectively shut down operation of the device, or selectively reduce a supply voltage of the device and at least one clock speed of the device.

Accordingly, some aspects and features of the disclosed embodiments are set out in the following numbered items:

1. A method of determining the adequacy of the current sourcing capability of a power source, comprising:
   dynamically detecting a current sourcing capability of the power source by sampling comparison values obtained during one or more sampling sub-windows and determining a sample density of comparison values;
   generating an insufficient-supply indication, that the current sourcing capability of the power source has fallen below a current threshold of a device supplied power by the power source in an overload condition, in response to the sample density of comparison values crossing a selectable density threshold; and
   in response to the sample density of comparison values crossing the selectable density threshold, a control element of the device controlling one or more of the device and the power source to have a compensatory response.

2. The method of item 1, further comprising in response to the sample density of comparison values crossing the selectable density threshold, the control element performing one or more of:
   controlling the device to generate an alert indication;
   controlling the device to selectively reduce the current load utilized by the device; and
   controlling the power source to increase its power sourcing capability to the device.

3. The method of item 2, where selectively reducing the current load of the device further comprises one or more of the control element of the device selectively shutting down operation of at least one load element of the device, the control element of the device selectively lowering power consumption utilized by the device, and the control element selectively scheduling the occurrence of at least one function of the device.

4. The method of item 3, further comprising the control element of the device performing one or more of selectively shutting down a display backlight function of the device, selectively shutting down an audible user feedback function of the device, and selectively shutting down operation of the device.

5. The method of item 4, further comprising the control element of the device performing one or more of selectively reducing a supply voltage of the device and selectively reducing at least one clock speed of the device.
6. The method of item 1, where the density threshold, a number of sampling cycles, the size of the sample window, and the number and size of the one or more sampling sub-windows are selectable.
7. The method of item 6, where the number of sub-windows is two or four.
8. A non-transitory computer-readable medium having computer-executable instructions for implementing the method of item 1.
9. A method of identifying an overload condition of a power source, comprising:
dynamically detecting a positive comparator signal sample within a sample window of time when an output voltage of the power source falls below a reference voltage for a duration that exceeds a threshold duration;
determining a sample density of the positive comparator signal samples detected during the sample window, where the sample density is the number of sampling cycles in which a positive comparator signal is detected; and
determining whether the sample density of positive comparator signal samples crosses a density threshold and is representative of an overload condition of the power source and if so, generating an insufficient-supply indication.
10. The method of item 9, where detecting is performed by a counting mechanism of a detector coupled to the power source.
11. The method of item 10, where the counting mechanism is a sample counter of the sample window.
12. The method of item 9, where a positive comparator signal sample is a detected comparator signal high-state.
13. The method of item 9, where the sample density of positive comparator signal samples crosses a density threshold either when the sample density exceeds the density threshold or when the sample density is less than the density threshold.
14. The method of item 9, where the density threshold, a number of sampling cycles, the size of the sample window, and the number and size of the one or more sampling sub-windows are selectable.
15. The method of item 14, where the number of sub-windows of the plurality of sub-windows is two or four.
16. The method of item 9, where the sample density is the number of sampling cycles in which a positive comparator signal is detected, summed across a plurality of sub-windows of the sample window and where each sub-window having its own sub-window sample counter.
17. The method of item 16, further comprising:
adjusting one or more sub-window sample counters of the plurality of sub-windows as new samples occurring during the sample window are detected.
18. The method of item 17, where adjusting comprises:
clearing the sub-window sample counter of one or more older sub-windows of the sample window.
19. A device, comprising:
a dynamic detection element of the device operable to dynamically detect a current sourcing capability of a power source and generate an insufficient-supply indication when the current sourcing capability of the power source has fallen below a current threshold of the device, where the detection element comprises:

a counting mechanism that counts positive comparator signal samples occurring within one or more sample sub-windows;
an adding mechanism coupled to the counting mechanism that sums the number of positive comparator signal samples occurring within the one or more sub-windows to determine a sample density of the detected positive comparator signal samples; and
a comparator that compares the determined sample density of the detected positive comparator signal samples to a density threshold and that, responsive to the sample density of the detected positive comparator signal samples exceeding the density threshold, generates the insufficient-supply indication.
20. The device of item 19, where the counting mechanism either increments or decrements in response to occurrence of positive comparator signal samples within the sub-window associated with the counter.
21. The device of item 19, where the counting mechanism comprises a plurality of selectable sample counters that each count positive comparator signal samples occurring within an associated sub-window of a plurality of sub-windows and where the adding mechanism is an adder.
22. The device of item 19, where the counting mechanism comprises a serial shift register of a length determined by specified window duration and the adding mechanism is a bit adder whose bit adder value is incremented or decremented in response to a positive comparator signal sample and where in response to determining that a bit adder value has crossed a setpoint threshold the comparator generates the insufficient-supply indication.
23. The device of item 19, further comprising:
a control element operable to monitor the insufficient-supply indication and, in response to generation of the insufficient-supply indication by the detection element, to control the device to have a compensatory response to the insufficient-supply indication or controls the power source to have a compensatory response to the insufficient-supply indication.
24. The device of item 23, where in response to the sample density of the detected positive comparator signal samples exceeding the density threshold, the control element is operable to control the power source to increase its power sourcing capability to the device.
25. The device of item 23, where in response to the sample density of the detected positive comparator signal samples exceeding the density threshold, the control element does one or more of: causes an alert indication to be generated and selectively reduces the load current drawn by the device.
26. The device of item 25, where the control element selectively reduces the load current drawn by the device by one or more of selectively shutting down operation of at least one load element of the device that draws load current when operational, by selectively lowering power consumption utilized by the device, and by selectively scheduling the occurrence of at least one function of the device.
27. The device of item 26, where the control element of the device selectively shuts down one or more of a display backlight load element of the device and an audible user feedback load element of the device, selectively shuts down operation of the device, or selectively reduces one or more of a supply voltage of the device and at least one clock speed of the device.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A method of determining the adequacy of the current sourcing capability of a power source, comprising:
   dynamically detecting a current sourcing capability of the power source by sampling comparison values obtained during one or more sampling sub-windows and determining a sample density of comparison values;
   generating an insufficient-supply indication, that the current sourcing capability of the power source has fallen below a current threshold of a device supplied power by the power source in an overload condition, in response to the sample density of comparison values crossing a selectable density threshold; and
   in response to the sample density of comparison values crossing the selectable density threshold, a control element of the device controlling one or more of the device and the power source to have a compensatory response, the control element performing one or more of:
      controlling the device to generate an alert indication;
      controlling the device to selectively reduce the current load utilized by the device; and
      controlling the power source to increase its power sourcing capability to the device.

2. The method of claim 1, where selectively reducing the current load of the device further comprises one or more of the control element of the device selectively shutting down operation of at least one load element of the device, the control element of the device selectively lowering power consumption utilized by the device, and the control element selectively scheduling the occurrence of at least one function of the device.

3. The method of claim 2, further comprising the control element of the device performing one or more of selectively shutting down a display backlight function of the device, selectively shutting down an audible user feedback function of the device, and selectively shutting down operation of the device.

4. The method of claim 3, further comprising the control element of the device performing one or more of selectively reducing a supply voltage of the device and selectively reducing at least one clock speed of the device.

5. A non-transitory computer-readable medium having computer-executable instructions for implementing the method of claim 1.

6. A method of determining the adequacy of the current sourcing capability of a power source, comprising:
   dynamically detecting a current sourcing capability of the power source by sampling comparison values obtained during one or more sampling sub-windows and determining a sample density of comparison values;
   generating an insufficient-supply indication, that the current sourcing capability of the power source has fallen below a current threshold of a device supplied power by the power source in an overload condition, in response to the sample density of comparison values crossing a selectable density threshold; and
   in response to the sample density of comparison values crossing the selectable density threshold, a control element of the device controlling one or more of the device and the power source to have a compensatory response,
   where the density threshold, a number of sampling cycles, the size of the sample window, and the number and size of the one or more sampling sub-windows are selectable.

7. The method of claim 6, further comprising in response to the sample density of comparison values crossing the selectable density threshold, the control element performing one or more of:
   controlling the device to generate an alert indication;
   controlling the device to selectively reduce the current load utilized by the device; and
   controlling the power source to increase its power sourcing capability to the device.

8. A method of identifying an overload condition of a power source, comprising:
   dynamically detecting a positive comparator signal sample within a sample window of time when an output voltage of the power source falls below a reference voltage for a duration that exceeds a threshold duration;
   determining a sample density of the positive comparator signal samples detected during the sample window, where the sample density is the number of sampling cycles in which a positive comparator signal is detected; and
   determining whether the sample density of positive comparator signal samples crosses a density threshold and is representative of an overload condition of the power source and if so, generating an insufficient-supply indication,.
   where the density threshold, a number of sampling cycles, the size of the sample window, and the number and size of the one or more sampling sub-windows are selectable.

9. The method of claim 8, where the sample density of positive comparator signal samples crosses a density threshold either when the sample density exceeds the density threshold or when the sample density is less than the density threshold.

10. A method of identifying an overload condition of a power source, comprising:
    dynamically detecting a positive comparator signal sample within a sample window of time when an output voltage of the power source falls below a reference voltage for a duration that exceeds a threshold duration;
    determining a sample density of the positive comparator signal samples detected during the sample window, where the sample density is the number of sampling cycles in which a positive comparator signal is detected; and
    determining whether the sample density of positive comparator signal samples crosses a density threshold and is representative of an overload condition of the power source and if so, generating an insufficient-supply indication,
    where the sample density is the number of sampling cycles in which a positive comparator signal is detected, summed across a plurality of sub-windows of the sample window, and where each sub-window has its own sub-window sample counter.

11. The method of claim 10, further comprising:
    adjusting one or more sub-window sample counters of the plurality of sub-windows as new samples occurring during the sample window are detected.

12. A device, comprising:
    a dynamic detection element of the device operable to dynamically detect a current sourcing capability of a power source and generate an insufficient-supply indication when the current sourcing capability of the power source has fallen below a current threshold of the device, where the detection element comprises:
  a counting mechanism that counts positive comparator signal samples occurring within one or more sample sub-windows;
  an adding mechanism coupled to the counting mechanism that sums the number of positive comparator signal samples occurring within the one or more sub-windows to determine a sample density of the detected positive comparator signal samples; and
  a comparator that compares the determined sample density of the detected positive comparator signal samples to a density threshold and that, responsive to the sample density of the detected positive comparator signal samples exceeding the density threshold, generates the insufficient-supply indication, and
a control element operable to monitor the insufficient-supply indication and, in response to generation of the insufficient-supply indication by the detection element, to control the device to have a compensatory response to the insufficient-supply indication or control the power source to have a compensatory response to the insufficient-supply indication,
where in response to the sample density of the detected positive comparator signal samples exceeding the density threshold, the control element does one or more of: causes an alert indication to be generated and selectively reduces the load current drawn by the device.

13. The device of claim 12, where the counting mechanism either increments or decrements in response to occurrence of positive comparator signal samples within the sub-window associated with the counter.

14. The device of claim 12, where in response to the sample density of the detected positive comparator signal samples exceeding the density threshold, the control element is operable to control the power source to increase its power sourcing capability to the device.

15. The device of claim 12, where the control element selectively reduces the load current drawn by the device by one or more of selectively shutting down operation of at least one load element of the device that draws load current when operational, by selectively lowering power consumption utilized by the device, and by selectively scheduling the occurrence of at least one function of the device.

16. A device, comprising:
a dynamic detection element of the device operable to dynamically detect a current sourcing capability of a power source and generate an insufficient-supply indication when the current sourcing capability of the power source has fallen below a current threshold of the device, where the detection element comprises:
  a counting mechanism that counts positive comparator signal samples occurring within one or more sample sub-windows;
  an adding mechanism coupled to the counting mechanism that sums the number of positive comparator signal samples occurring within the one or more sub-windows to determine a sample density of the detected positive comparator signal samples; and
a comparator that compares the determined sample density of the detected positive comparator signal samples to a density threshold and that, responsive to the sample density of the detected positive comparator signal samples exceeding the density threshold, generates the insufficient-supply indication,
where the counting mechanism comprises a plurality of selectable sample counters that each count positive comparator signal samples occurring within an associated sub-window of a plurality of sub-windows and where the adding mechanism is an adder.

17. A device, comprising:
a dynamic detection element of the device operable to dynamically detect a current sourcing capability of a power source and generate an insufficient-supply indication when the current sourcing capability of the power source has fallen below a current threshold of the device, where the detection element comprises:
  a counting mechanism that counts positive comparator signal samples occurring within one or more sample sub-windows;
  an adding mechanism coupled to the counting mechanism that sums the number of positive comparator signal samples occurring within the one or more sub-windows to determine a sample density of the detected positive comparator signal samples; and
a comparator that compares the determined sample density of the detected positive comparator signal samples to a density threshold and that, responsive to the sample density of the detected positive comparator signal samples exceeding the density threshold, generates the insufficient-supply indication,
where the counting mechanism comprises a serial shift register of a length determined by specified window duration and the adding mechanism is a bit adder whose bit adder value is incremented or decremented in response to a positive comparator signal sample and where in response to determining that a bit adder value has crossed a setpoint threshold the comparator generates the insufficient-supply indication.

* * * * *